(12) United States Patent
Sera et al.

(10) Patent No.: US 6,424,214 B2
(45) Date of Patent: Jul. 23, 2002

(54) STRAIN ERROR COMPENSATION AMPLIFIER

(75) Inventors: Yasuo Sera; Takashi Uchida; Terufumi Nagano; Masahiro Himono, all of Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 36 days.

(21) Appl. No.: 09/727,780

(22) Filed: Dec. 4, 2000

(30) Foreign Application Priority Data

Dec. 3, 1999 (JP) .......................... 11-344591

(51) Int. Cl.[7] .............................. H03F 1/00; H03F 1/26
(52) U.S. Cl. ........................................ 330/151; 330/149
(58) Field of Search ................................ 330/151, 149; 333/109, 164, 156

(56) References Cited

U.S. PATENT DOCUMENTS

| | | | | |
|---|---|---|---|---|
| 4,438,415 A | * | 3/1984 | Hopfer | 333/164 |
| 4,625,178 A | * | 11/1986 | Mannerstrom | 330/149 |
| 4,677,390 A | * | 6/1987 | Wagner | 330/149 |
| 4,902,983 A | * | 2/1990 | Fujiki et al. | 330/149 |
| 5,252,934 A | | 10/1993 | Myer | 333/156 |
| 5,986,500 A | * | 11/1999 | Park et al. | 330/124 D |
| 6,172,560 B1 | * | 1/2001 | Yamashita et al. | 330/151 |

OTHER PUBLICATIONS

Hayashi et al, IEICE Trans. on Electronics ..., vol. E80–C, No. 6 "A Low Distortion Technique ...", pp. 768–774, Jun. 1, 1997.

Imaoka et al, Proc. of the EPO Microwave ..., vol. 25, "A Millimeter–Wave Wideband ...", pp. 1001–1005, Sep. 4, 1995.

* cited by examiner

Primary Examiner—Robert Pascal
Assistant Examiner—Patricia T. Nguyen
(74) Attorney, Agent, or Firm—Jacobson Holman, PLLC

(57) ABSTRACT

According to the present invention, there is provided a strain (error) compensation amplifier which realizes miniaturization, loss reduction, and cost reduction. In the strain (error) compensation amplifier, by unifying at least two or more of a power distributor, a first delay unit, a first power synthesizer, a second delay unit, a second power synthesizer, a directional coupler, an isolator and a terminating resistor, the miniaturization, loss reduction, and cost reduction are realized.

22 Claims, 25 Drawing Sheets

STRAIN ERROR COMPENSATION AMPLIFIER

BACKGROUND OF THE INVENTION

1. Field of the Invention

The present invention relates to a strain compensation amplifier for use in a base station, a relay apparatus, and the like of mobile communication systems such as a car phone, a cellular phone, and a personal handy phone system, and relates to miniaturization, loss reduction and cost reduction achieved by unifying a part of a circuit.

2. Description of the Related Art

A base station and a radio relay apparatus in a car phone, a cellular phone system, and the like are provided with a multifrequency common amplifier for simultaneously amplifying a multifrequency signal. In the multifrequency common amplifier, linearity needs to be sufficiently improved in order to minimize occurrence of mutual modulation strain, and a small-size high-linearity amplifier has been used. As one of the amplifiers, a strain compensation amplifier (self-adjusting feedforward amplifier) is used, and constituted in such a manner that the mutual modulation strain and noise generated in the amplifier are compensated by self adjustment.

This strain compensation amplifier is constituted of a strain detection circuit and a strain removal circuit, the strain detection circuit including a main amplifier which is a compensation object amplifier detects a strain component except an input signal, the detected strain component (error component) is inputted to the strain removal circuit including an auxiliary amplifier (error amplifier) to amplify the strain component, and subsequently negative-phase synthesis with a multifrequency amplification signal is performed to offset the strain component in the constitution.

FIG. 5 is a diagram showing a constitution example of a conventional strain compensation amplifier. In FIG. 5, numeral 1 denotes an input terminal, 2 denotes a power distributor for distributing an output of the terminal, 3 denotes a first variable attenuator, 4 denotes a first variable phase unit, 5 denotes a main amplifier, 6 denotes a delay line, 7 denotes a first power synthesizer, 8 denotes a second variable attenuator, 9 denotes a second variable phase unit, 10 denotes an auxiliary amplifier, 11 denotes a delay filter, 12 denotes a second power synthesizer, 13 denotes a directional coupler, 14 denotes an isolator, 15, 16 denote terminating resistors, 17, 18, 19 denote coaxial cables, 20 denotes an output terminal, 21 denotes a monitor terminal, and 22 denotes a connector.

An input signal Pin is inputted to the power distributor 2 from the input terminal 1, passed through two branched main lines, and distributed to the delay line 6 and first variable attenuator 3, and an output of the first variable attenuator 3 is passed through the first variable phase unit 4 and amplified by the main amplifier 5. An amplification signal including a strain component generated during amplification is inputted to the first power synthesizer 7, and synthesized with the input signal passed through the main line distributed by the power distributor 2 and the delay line 6 by the first power synthesizer 7, so that the strain component is detected.

The amplification signal outputted from the first power synthesizer 7 is inputted to the second power synthesizer 12 via the delay filter 11. On the other hand, the strain component outputted from the first power synthesizer 7 is passed through the second variable attenuator 8 and second variable phase unit 9, amplified by the auxiliary amplifier 10, inputted to the second power synthesizer 12 so that polarity is reversed, and synthesized with the amplification signal including the strain component inputted via the delay filter 11 so that the strain component is offset, and a common amplification signal with little strain is outputted. For this output, a monitor output is obtained from the monitor terminal 21 by the directional coupler 13, a unidirectional property is enhanced by the isolator 14, and an output signal Pout is outputted via the output terminal 20. Here, the delay filter 11 and second power synthesizer 12, the second power synthesizer 12 and directional coupler 13, and the directional coupler 13 and isolator 14 are connected to each other, respectively, via the connectors 22 and coaxial cables 17, 18, 19, and the terminating resistors 15, 16 are connected to the second power synthesizer 12 and the directional coupler 13 via the connectors. In this strain compensation amplifier, the variable attenuators 3, 8, and variable phase units 4, 9 are adjusted by a pilot signal control and a desired operation is performed. Additionally, these control systems are omitted from FIG. 5.

Moreover, in the conventional power synthesizer, and directional coupler, a tri-plate structure is generally used in which an electrode pattern is held between dielectric substrates in a sandwich manner as shown in FIG. 6. The electrode pattern is connected to an input/output terminal, and entirely contained in a shield case. The dielectric used in the tri-plate structure is slightly larger than air in loss. Furthermore, since the conventional power synthesizer and directional coupler are individually contained in the shield cases, a large number of assembly processes are necessary.

In the conventional strain compensation amplifier, the power distributor and delay unit of the strain detection circuit, and the delay unit, power synthesizer, directional coupler, isolator, and terminating resistor of the strain removal circuit are constituted separately from one another, contained separately in the individual shield cases, and coupled to one another by the connectors and coaxial cables. Additionally, since the delay filter or the delay line using the coaxial cable is used in the delay unit, it is difficult to miniaturize the strain compensation amplifier. For connection via the connector and coaxial cable, since an operation space is necessary during assembly, it is further difficult to miniaturize the amplifier. Furthermore, efficiency enhancement of the strain compensation amplifier, loss reduction particularly on and after the first power synthesizer, material cost reduction and assembly process number reduction and another cost reduction raise problems.

In order to miniaturize the strain compensation amplifier, miniaturization of the strain removal circuit needs to be performed, and to realize low power consumption, a necessity of reducing power loss in the strain removal circuit has occurred.

SUMMARY OF THE INVENTION

An object of the present invention is to solve the aforementioned problems, and provide a strain compensation amplifier which realizes miniaturization, loss reduction, and cost reduction.

To achieve the aforementioned object, in the strain compensation amplifier of the present invention, the following means is used to realize miniaturization, loss reduction, and cost reduction of the strain compensation amplifier.

Specifically, according to the present invention, there is provided a strain compensation amplifier including: a strain detection circuit in which an input signal is distributed by a power distributor, and a signal obtained by amplifying one output by a main amplifier via a first variable attenuator and a first variable phase unit is synthesized with a signal obtained by adjusting a timing of another output distributed from the power distributor by a first delay unit by a first power synthesizer to detect a strain component generated in the main amplifier; and a strain removal circuit in which a signal obtained by amplifying the strain component outputted from the first power synthesizer by an auxiliary amplifier via a second variable attenuator and a second variable phase unit is reverse-phase synthesized with a signal obtained by adjusting a timing of a signal outputted from the first power synthesizer and amplified by the main amplifier by a second delay unit by a second power synthesizer to offset the strain component, a monitor output is obtained by a directional coupler, and a unidirectional property is enhanced by an isolator to obtain a power synthesis output, and in this strain compensation amplifier, at least two or more of the power distributor, the first delay unit, the first power synthesizer, the second delay unit, the second power synthesizer, the directional coupler, the isolator, a terminating resistor of the second power synthesizer, and the terminating resistor of the directional coupler are unified.

DESCRIPTION OF REFERENCE NUMERALS

1 . . . input terminal, 2 . . . power distributor, 3, 8 . . . variable attenuator, 4, 9 . . . variable phase unit, 5...main amplifier, 6 . . . delay line, 7, 12 . . . power synthesizer, 10 . . . auxiliary amplifier, 11 . . . delay filter, 13 . . . directional coupler, 14, 68 . . . isolator, 15, 16 . . . terminating resistor, 17, 18, 19 . . . coaxial cable, 20, 67 . . . output terminal, 21, 66 . . . monitor terminal, 22 . . . connector, 50, 57 . . . unified delay filter, 51, 58, 70 . . . unified power synthesizer, 52, 71 . . . unified directional coupler, 53, 68 . . . unified isolator, 54, 55 . . . unified terminating resistor, 56 . . . unified power distributor, 61 . . . delay filter input terminal, 62 . . . hollow resonator filter, 63 . . . insulator, 64, 65 . . . terminating resistor fixed with screws to a shield case, 69 . . . shield case, 72 . . . power synthesizer input terminal

DETAILED DESCRIPTION OF THE PREFERRED EMBODIMENTS

Figure 1:
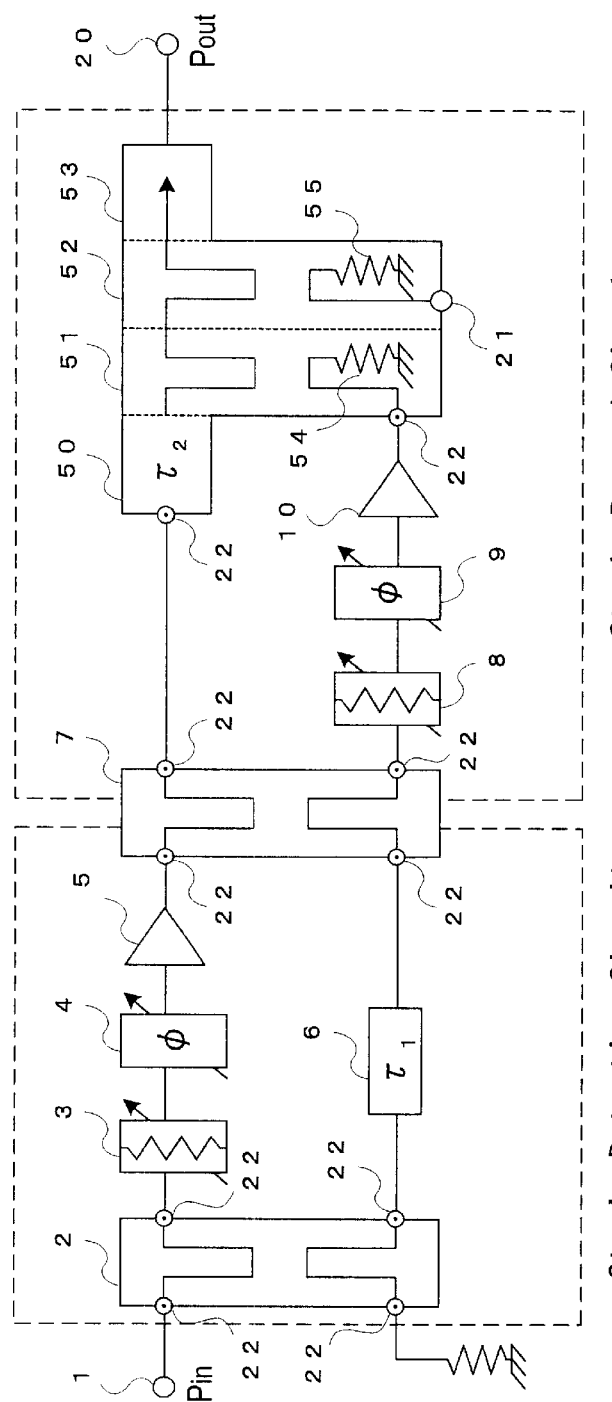
FIG. 1 is a constitution example diagram of a first embodiment of a strain compensation amplifier according to the present invention.

Embodiments of a strain compensation amplifier according to the present invention will be described hereinafter with reference to the drawings. FIG. 1 is a constitution example diagram showing a first embodiment of the strain compensation amplifier according to the present invention, and is a constitution example diagram in which a first power synthesizer output and the subsequent outputs particularly important in enhancing an efficiency of the strain compensation amplifier are unified. In FIG. 1 the reference numerals 1 to 10 and 20 to 22 are similar to those shown in a conventional constitution diagram of FIG. 5. Numeral 50 denotes a delay filter (second delay unit) unified according to the present invention, 51 denotes a unified power synthesizer, 52 denotes a unified directional coupler, 53 denotes a unified isolator, and 54, 55 denote unified terminating resistors.

In the present invention, the delay filter, power synthesizer, directional coupler, isolator, and terminating resistor, which have heretofore been separate constitutions, are formed in a unified structure, a connector and coaxial cable for connecting these to one another become unnecessary, and miniaturization and cost reduction are realized. Specifically, a space of the connector and coaxial cable, and an operation space for connecting the connector to a coaxial cable plug are unnecessary so that miniaturization is realized, the aforementioned structure can result in structure simplification and assembly process number reduction, and further the expensive connector and coaxial cable for a high frequency are unnecessary so that the cost reduction can be realized.

Figure 2A:
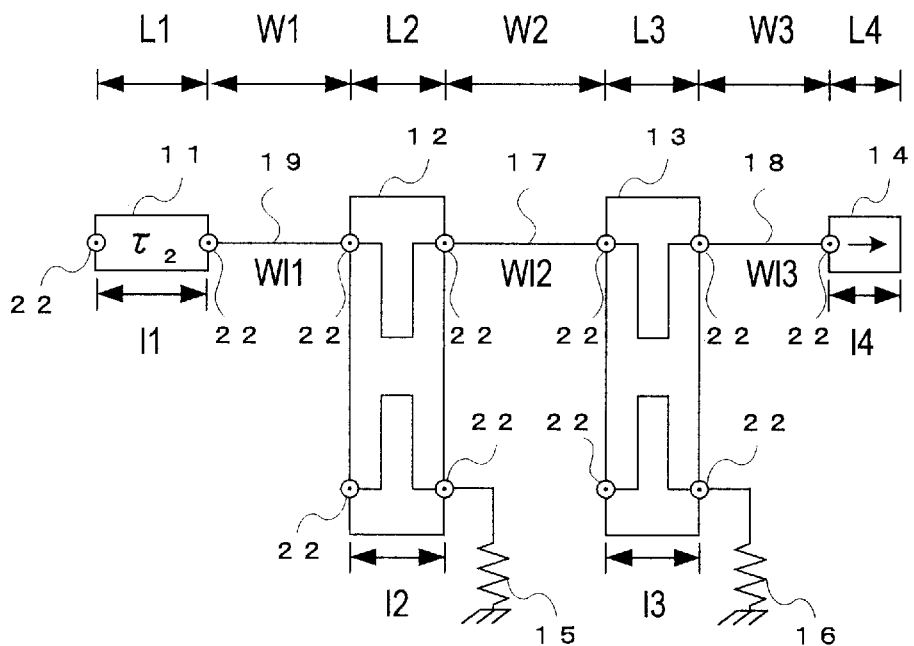
FIGS. 2A and 2B are diagrams showing an example for comparing the present invention with a conventional strain compensation amplifier constitution.
Figure 2B:
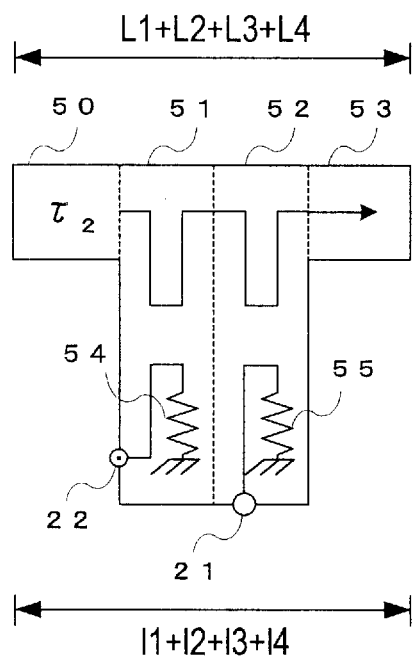

FIG. 2 is a diagram showing an example for comparing the conventional constitution with the constitution of the first embodiment of the present invention in outer dimension and power loss. In the constitution of the first embodiment of the present invention, an outer dimension for coaxial cable lengths W1, W2, W3 can be shortened, and losses W11, W12, W13 for the coaxial cables can be reduced. For example, since in a 2 GHz band the length of each coaxial cable is 4 cm and each loss is about 0.1 dB, the reduction of the outer dimension of 12 cm and loss of about 0.3 dB for three coaxial cables can be realized. Furthermore, in the conventional constitution, a dispersion of a delay amount by dispersions of the cable lengths W1, W2, W3 during manufacture of the coaxial cables has been a problem, but the present invention obviates a necessity of the coaxial cables, and it is therefore easy to manage the delay amount. Moreover, in the conventional constitution it has been general to use a tri-plate structure using a dielectric substrate in the power distributor, power synthesizer, and directional coupler, but in the present invention, a conductor wire in air is disposed in the vicinity, cost reduction is therefore possible with a simple structure, and additionally the loss can be reduced by the loss of the dielectric.

Figure 3:
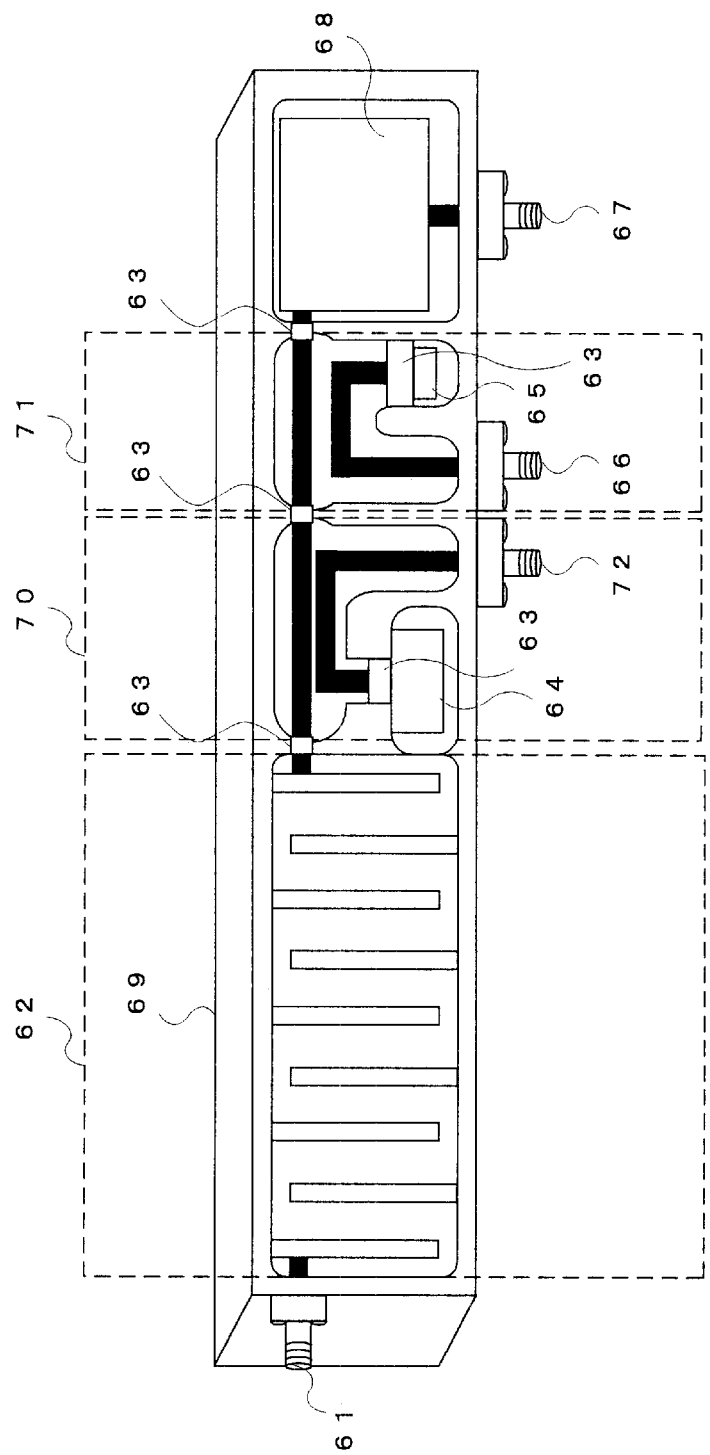
FIG. 3 is a diagram showing a unified structure example of the strain compensation amplifier of the present invention.

FIG. 3 is a diagram showing a unified structure example of the strain compensation amplifier according to the first embodiment of the present invention. Numeral 61 denotes a hollow resonator filter input terminal, 62 denotes a hollow resonator filter, 63 denotes an insulator, 64, 65 denote terminating resistors, 66 denotes a monitor terminal, 67 denotes an output terminal, 68 denotes an isolator, 69 denotes a shield case, 70 denotes a unified power synthesizer, 71 denotes a unified directional coupler, and 72 denotes a power synthesizer input terminal.

In the first embodiment of the present invention, the hollow resonator filter 62, power synthesizer 70, directional coupler 71, and isolator 68 are successively connected, connected portions are insulated by the unified shield case 69 and insulator 63 of Teflon or the like, and the shield case 69 is structured and unified in such a manner that chambers divided by functions are disposed to bring about a shield effect. Therefore, as compared with a conventional case in which the components are individually contained in the shield cases, one shield case can be used. Therefore, for example, when a shield case mold is prepared, instead of three molds, one mold is sufficient, which can depress a material cost. The hollow resonator filter for use in the present invention can be miniaturized with a higher use frequency. Specifically, a predetermined number of filters are necessary in order to obtain a constant delay amount, but with a higher frequency a wavelength becomes shorter, and even with the same number of filters the miniaturization can be realized. Moreover, since the terminating resistors 64, 65 are directly fixed to the shield case with screws, a heat dissipation effect can be enhanced.

Figure 4:
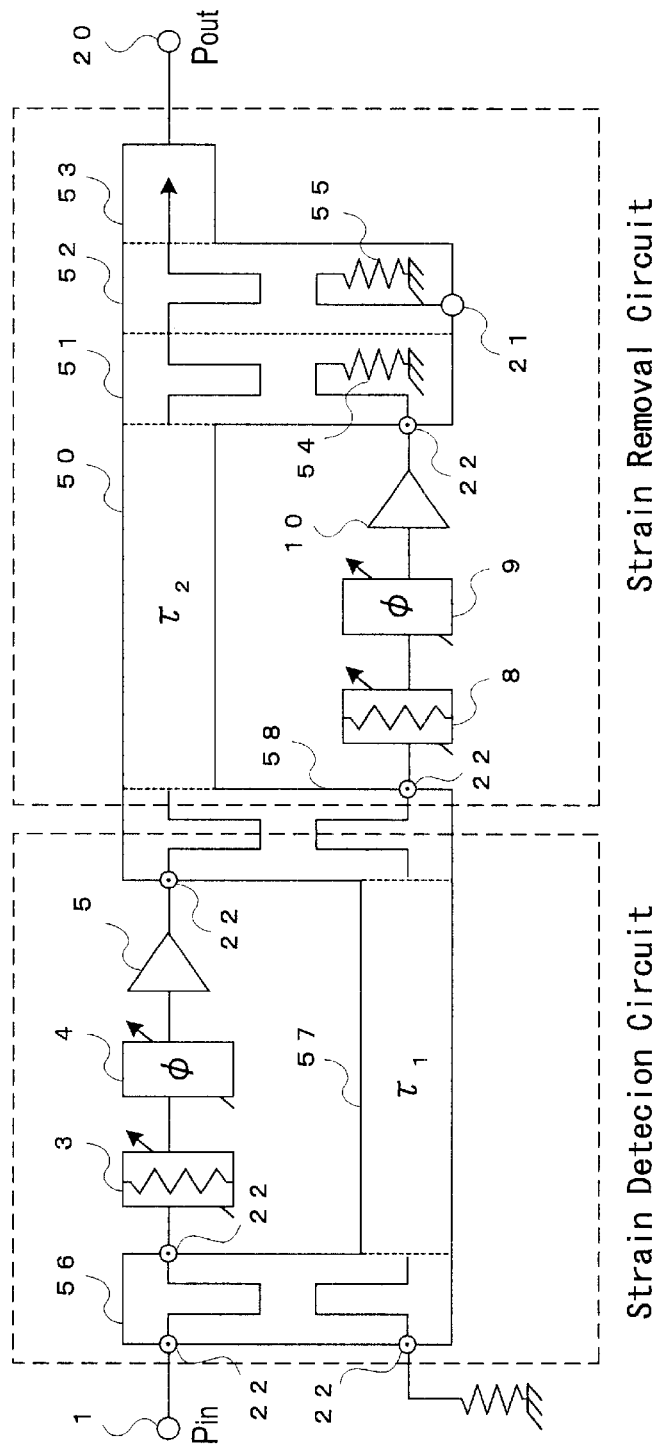
FIG. 4 is a constitution example diagram of a second embodiment of the strain compensation amplifier according to the present invention.

FIG. 4 is a constitution example diagram showing a second embodiment of the strain compensation amplifier according to the present invention. In FIG. 4 the reference numerals 1, 3 to 5, 8 to 10, 20 to 22 are similar to those shown in the conventional constitution diagram of FIG. 5. Moreover, the reference numerals 51 to 55 are similar to those shown in the constitution example diagram of the first embodiment of the present invention of FIG. 2. Numeral 50 denotes a unified second delay filter (delay unit), 56 denotes a unified power distributor, 57 denotes a unified first delay filter (delay nit), and 58 denotes a unified first power synthesizer.

In the second embodiment of the present invention, the power distributor, first delay unit, first power synthesizer, second delay unit, second power synthesizer, directional coupler, isolator, and terminating resistor, which have heretofore been separate constitutions, are formed in the unified structure, the connector and coaxial cable for connecting these to one another become unnecessary, and the miniaturization and cost reduction are further realized as compared with the first embodiment.

Additionally, in the constitution of the first embodiment, the second delay unit, second power synthesizer, directional coupler, isolator, and terminating resistor are unified, while in the constitution of the second embodiment, the power distributor, first delay unit, first power synthesizer, second delay unit, second power synthesizer, directional coupler, isolator, and terminating resistor are unified in the shown example. However, in the present invention, the unification is not necessarily limited to the aforementioned combinations, and by unifying at least two or more of the power distributor, first delay unit, first power synthesizer, second delay unit, second power synthesizer, directional coupler, isolator, and terminating resistor, the object of the present invention can be achieved.

Various unified combinations will concretely be described hereinafter. To facilitate the description, it is assumed in the description that the terminating resistor has already been unified.

First, with respect to a case in which adjacent two constitutions of the power distributor, first delay unit, first power synthesizer, second delay unit, second power synthesizer, directional coupler and isolator are unified, third to eighth embodiments will be described with reference to the constitution example diagrams of FIGS. 7 to 12. Additionally, in FIGS. 7 to 12, a state is shown in which the terminating resistor is unified, but the terminating resistor may not be unified.

Figure 5:
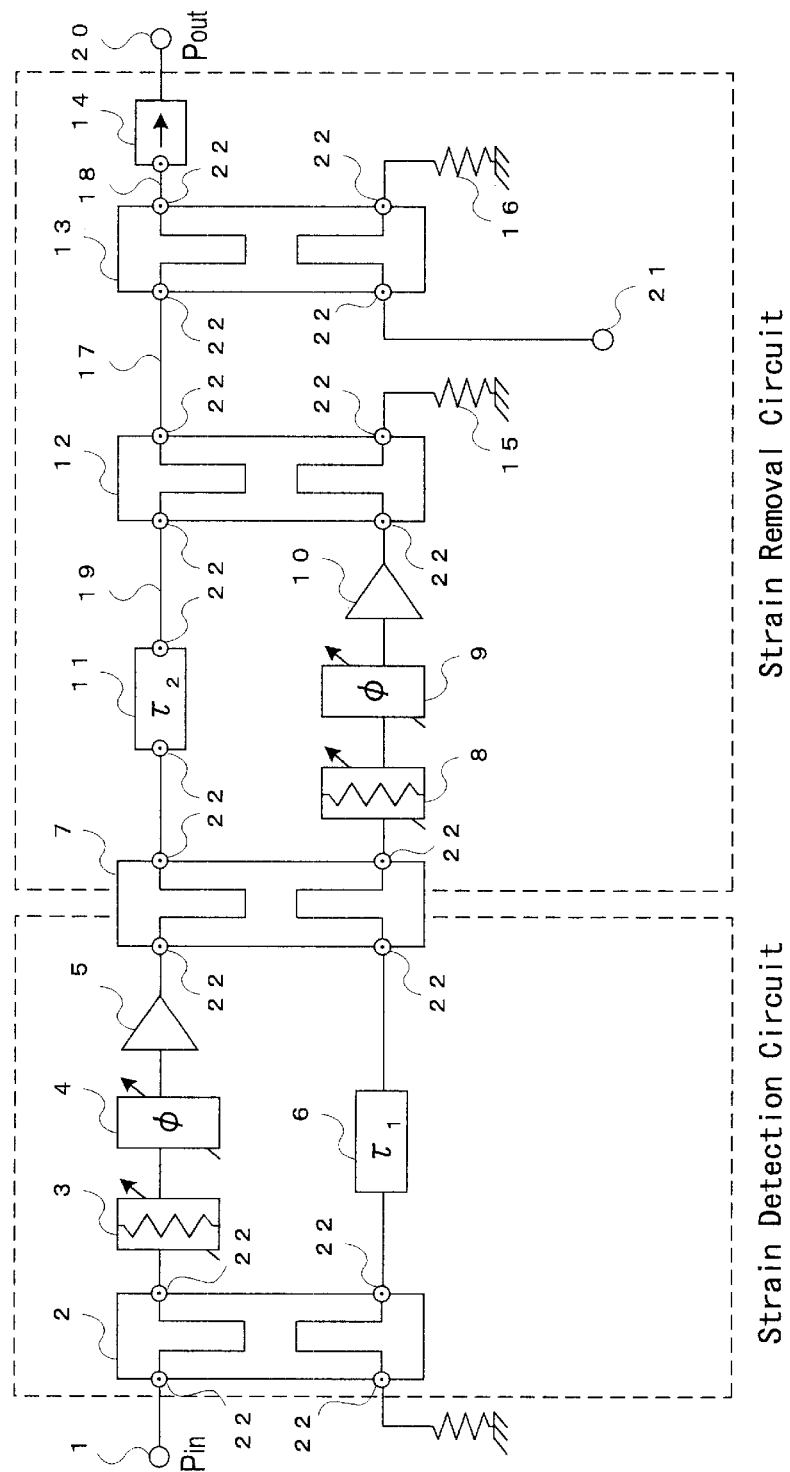
FIG. 5 is a constitution example diagram of a conventional strain compensation amplifier.
Figure 6:
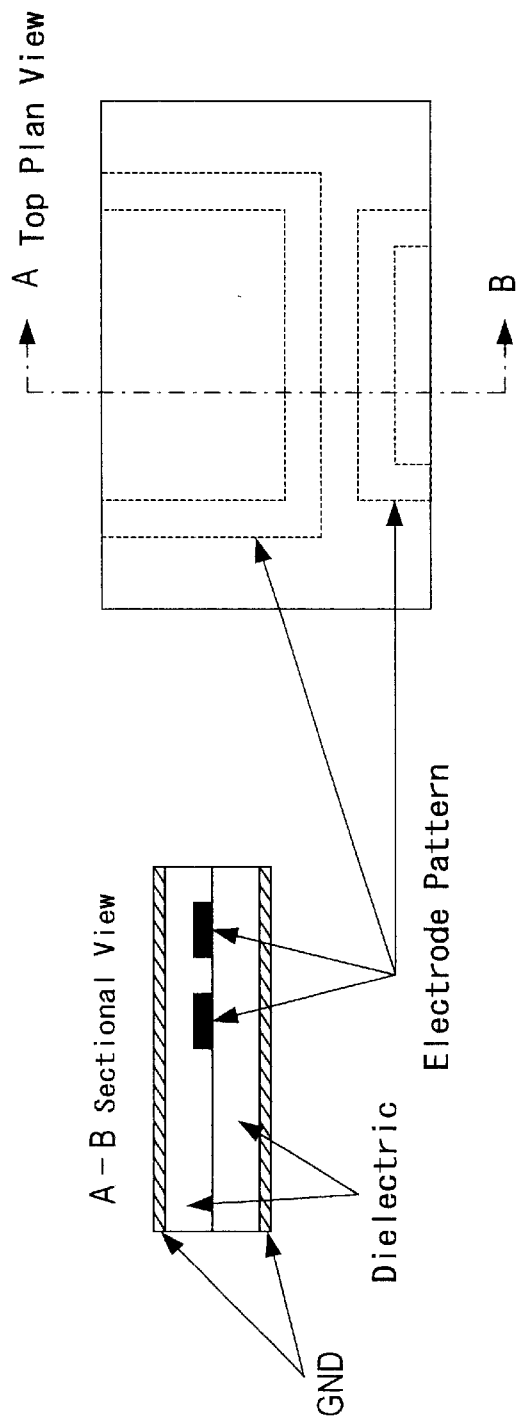
FIG. 6 is a constitution example diagram of a power distributor, a power synthesizer, and a directional coupler in the conventional strain compensation amplifier.
Figure 7:
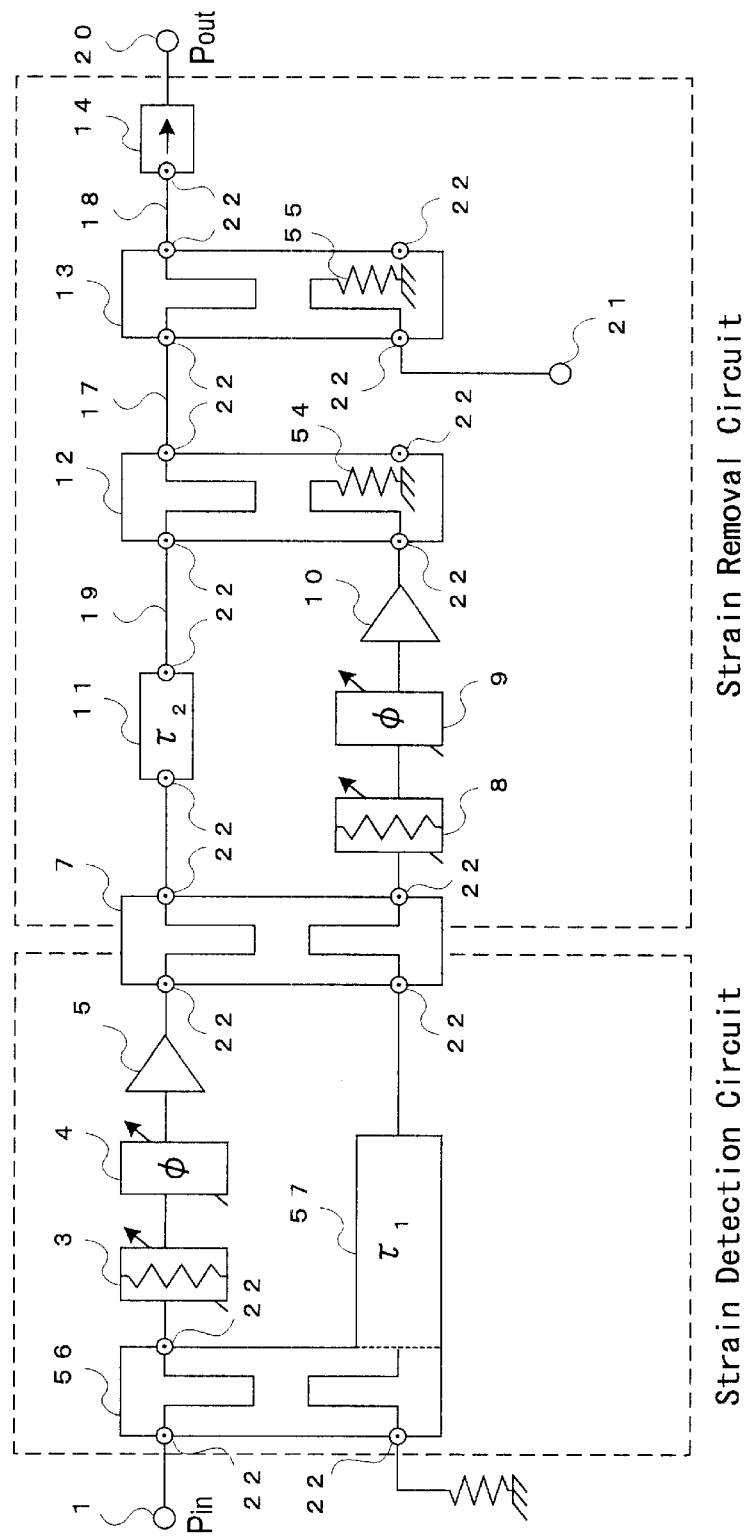
FIG. 7 is a constitution example diagram of a third embodiment of the strain compensation amplifier according to the present invention.

For the strain compensation amplifier according to the third embodiment of the present invention, as shown in FIG. 7, the power distributor and first delay unit in the strain detection circuit are unified, the circuit is constituted of the unified power distributor 56 and unified first delay unit 57, the connector and coaxial cable for connecting these to each other become unnecessary, and other constitutions (numerals 1, 3 to 5, 7 to 14, 20 to 22) are also shown in the conventional constitution diagram of FIG. 5.

Figure 8:
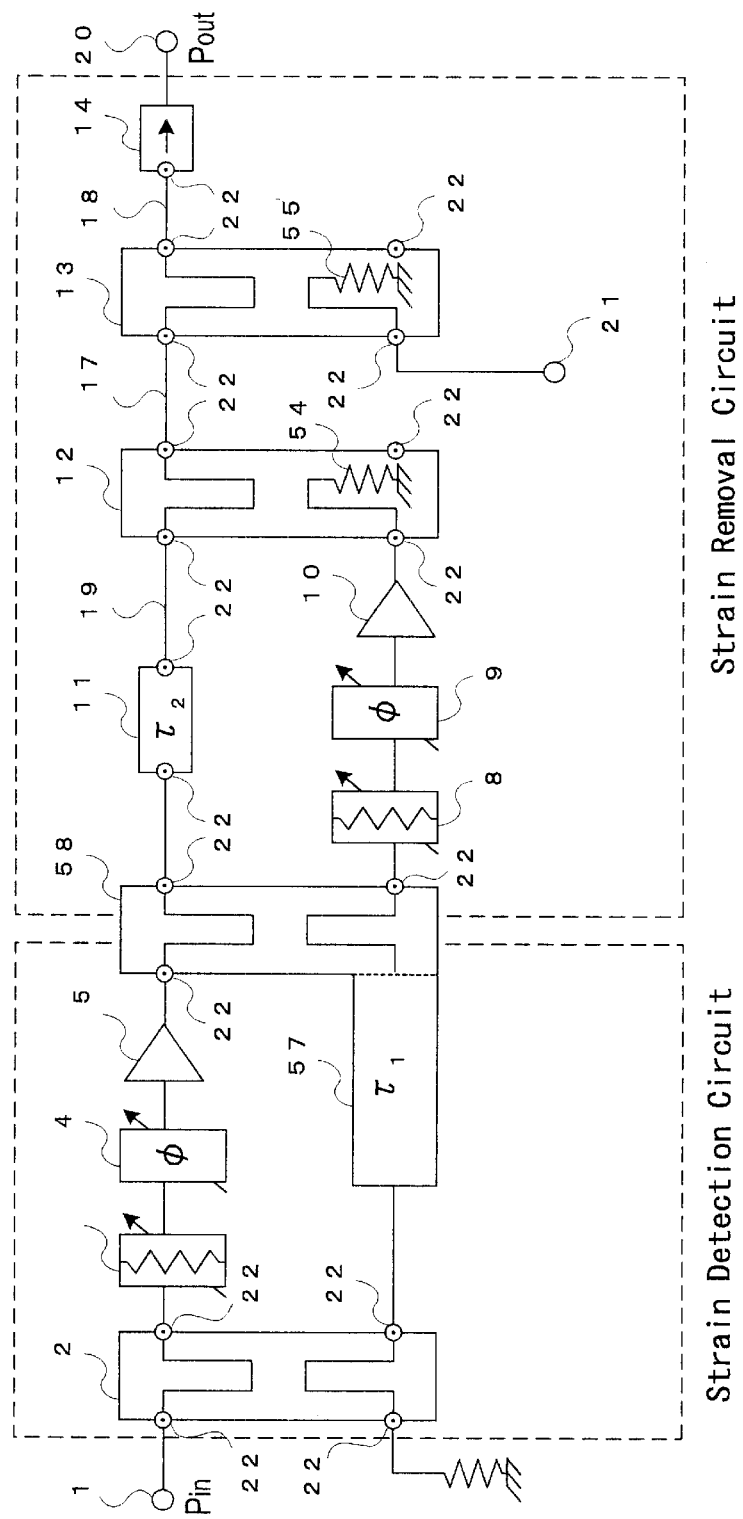
FIG. 8 is a constitution example diagram of a fourth embodiment of the strain compensation amplifier according to the present invention.

For the strain compensation amplifier according to the fourth embodiment of the present invention, as shown in FIG. 8, the first delay unit and first power synthesizer in the strain detection circuit are unified, the circuit is constituted of the unified delay unit 57 and unified first power synthesizer 58, the connector and coaxial cable for connecting these units to each other become unnecessary, and the other constitutions (numerals 1 to 5, 8 to 14, 20 to 22) are also shown in the conventional constitution diagram of FIG. 5.

Figure 9:
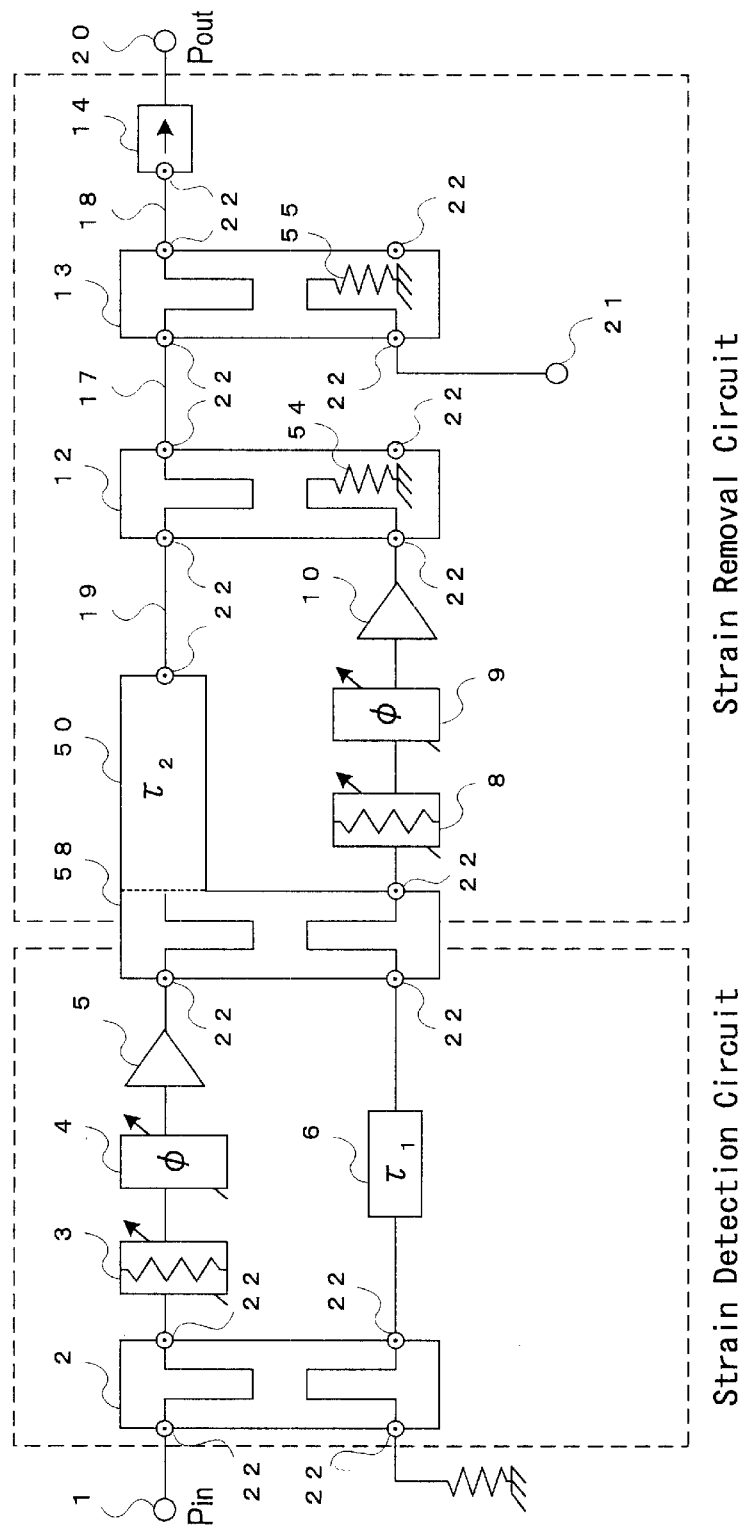
FIG. 9 is a constitution example diagram of a fifth embodiment of the strain compensation amplifier according to the present invention.

For the strain compensation amplifier according to the fifth embodiment of the present invention, as shown in FIG. 9, the power synthesizer and second delay unit in the strain removal circuit are unified, the circuit is constituted of the unified first power synthesizer 58 and unified second delay unit 50, the connector and coaxial cable for connecting these units to each other become unnecessary, and the other constitutions (numerals 1 to 6, 8 to 10, 12 to 14, 20 to 22) are also shown in the conventional constitution diagram of FIG. 5.

Figure 10:
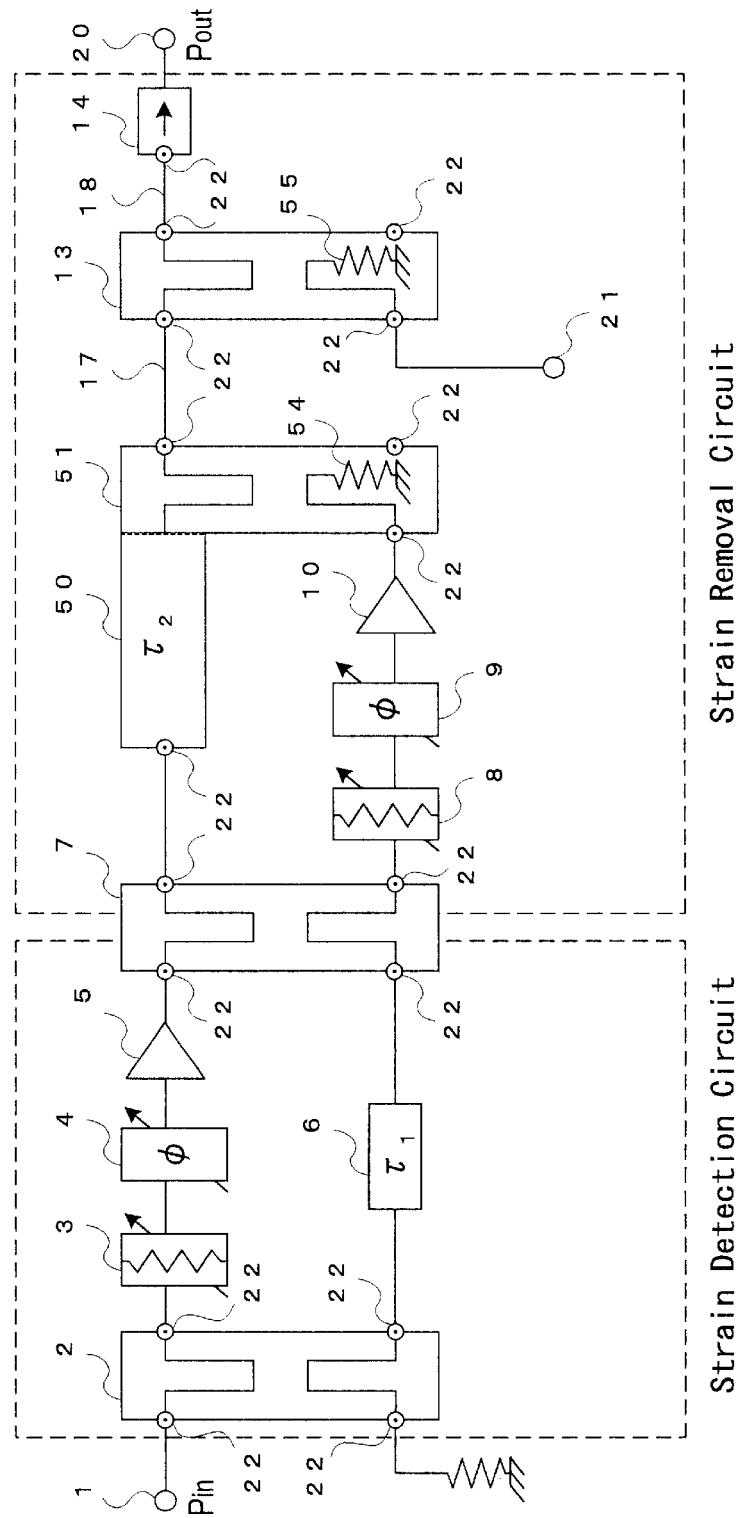
FIG. 10 is a constitution example diagram of a sixth embodiment of the strain compensation amplifier according to the present invention.

For the strain compensation amplifier according to the sixth embodiment of the present invention, as shown in FIG. 10, the second delay unit and second power synthesizer in the strain removal circuit are unified, the circuit is constituted of the unified second delay unit 50 and unified second power synthesizer 51, the connector and coaxial cable for connecting these units to each other become unnecessary, and the other constitutions (numerals 1 to 10, 13 and 14, 20 to 22) are also shown in the conventional constitution diagram of FIG. 5.

Figure 11:
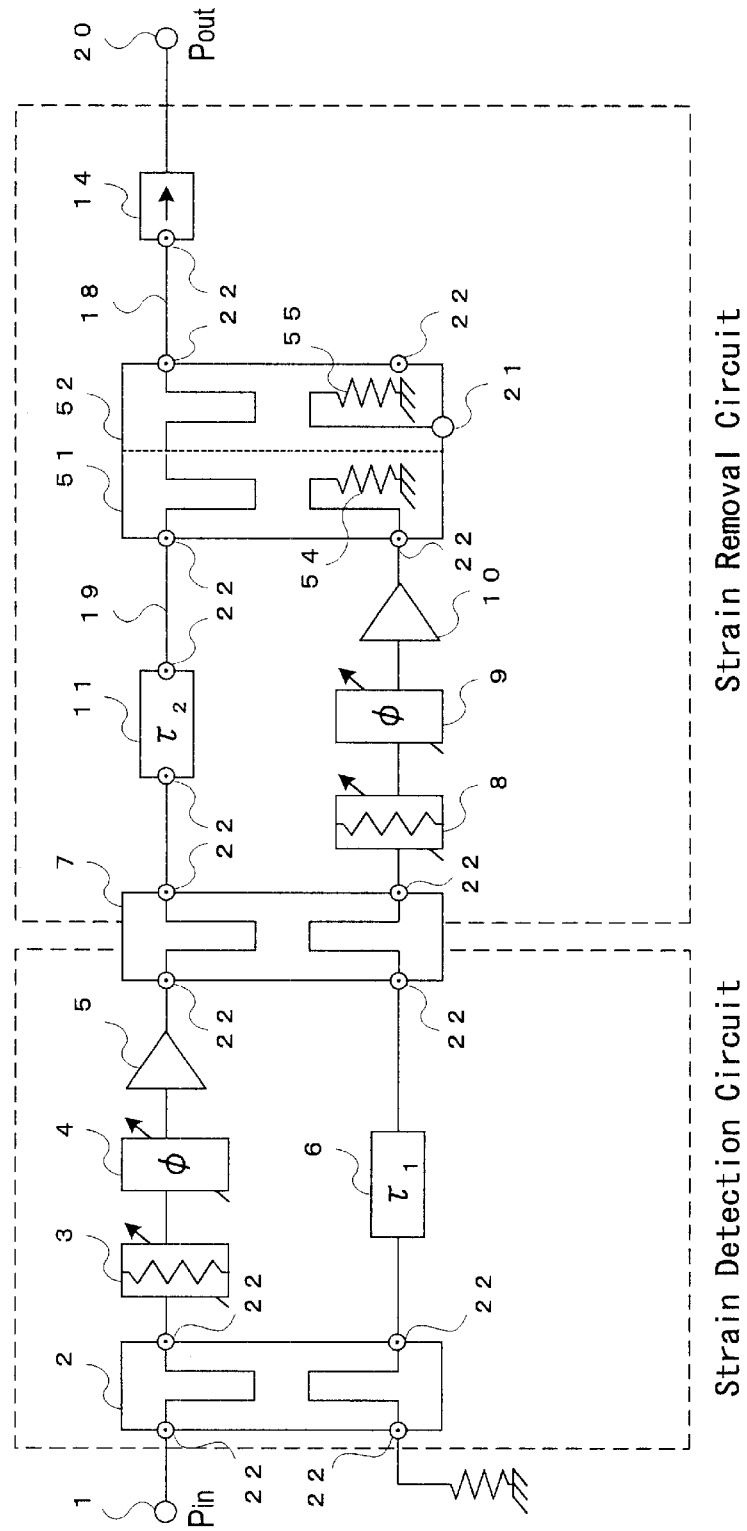
FIG. 11 is a constitution example diagram of a seventh embodiment of the strain compensation amplifier according to the present invention.

For the strain compensation amplifier according to the seventh embodiment of the present invention, as shown in FIG. 11, the second power synthesizer and directional coupler in the strain removal circuit are unified, the circuit is constituted of the unified second power synthesizer 51 and unified directional coupler 52, the connector and coaxial cable for connecting these units to each other become unnecessary, and the other constitutions (numerals 1 to 11, 14, 20 to 22) are also shown in the conventional constitution diagram of FIG. 5.

Figure 12:
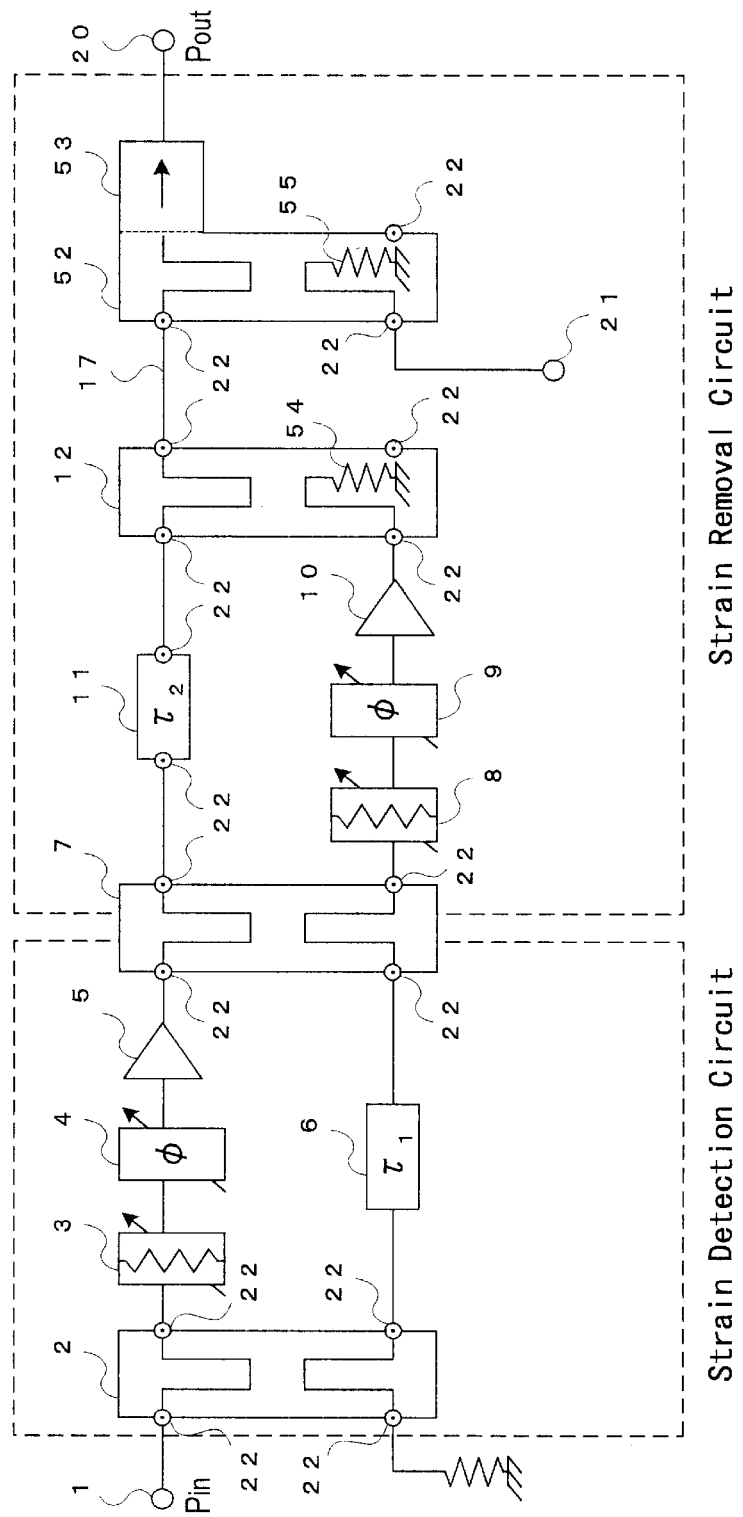
FIG. 12 is a constitution example diagram of an eighth embodiment of the strain compensation amplifier according to the present invention.

For the strain compensation amplifier according to the eighth embodiment of the present invention, as shown in FIG. 12, the directional coupler and isolator in the strain removal circuit are unified, the circuit is constituted of the unified directional coupler 52 and unified isolator 53, the connector and coaxial cable for connecting these units to each other become unnecessary, and the other constitutions (numerals 1 to 12, 20 to 22) are also shown in the conventional constitution diagram of FIG. 5.

Next, with respect to a case in which adjacent three constitutions of the power distributor, first delay unit, first power synthesizer, second delay unit, second power synthesizer, directional coupler, and isolator are unified, ninth to thirteenth embodiments will be described with reference to the constitution example diagrams of FIGS. 13 to 17. Additionally, in FIGS. 13 to 17, the state is shown in which the terminating resistor is unified, but the terminating resistor may not be unified.

Figure 13:
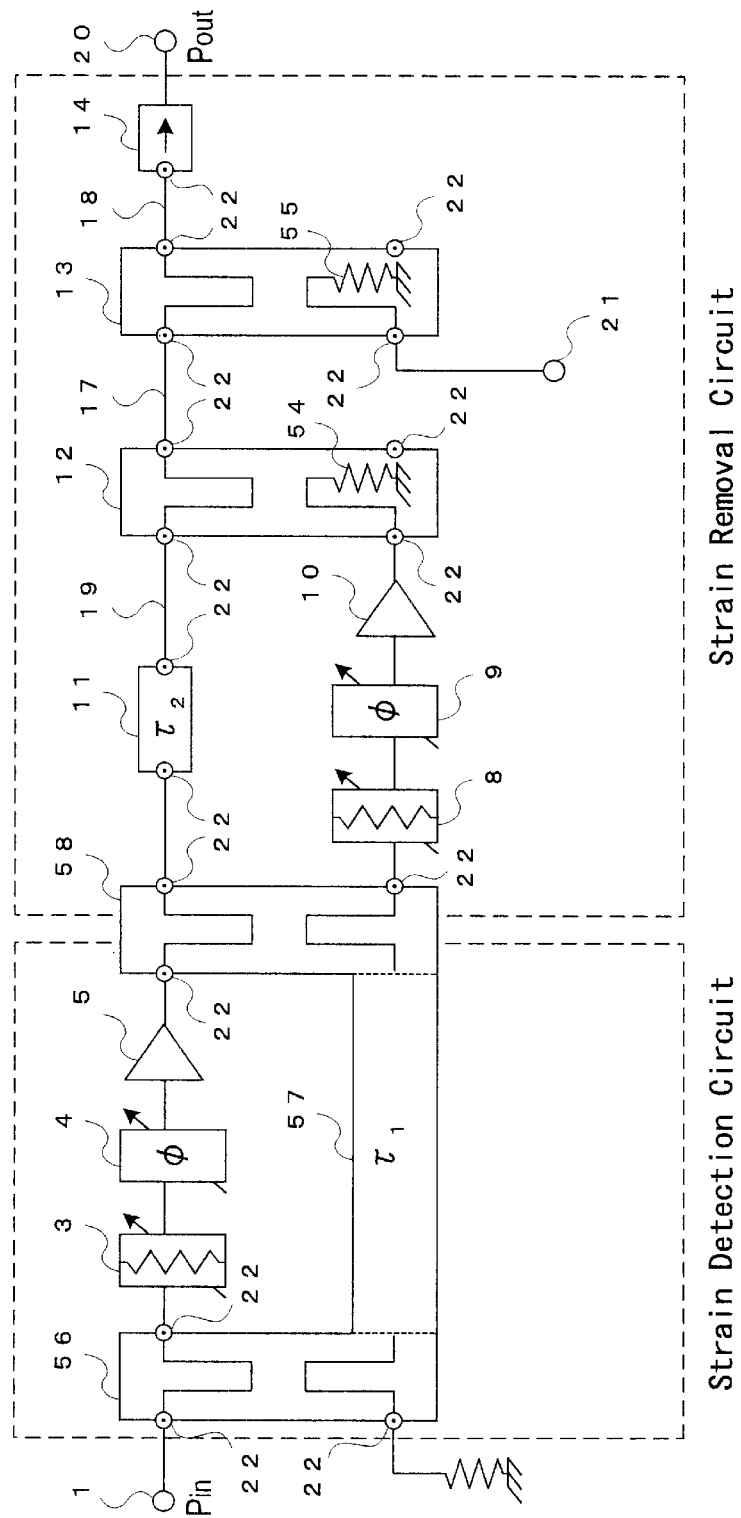
FIG. 13 is a constitution example diagram of a ninth embodiment of the strain compensation amplifier according to the present invention.

For the strain compensation amplifier according to the ninth embodiment of the present invention, as shown in FIG. 13, the power distributor, first delay unit and first power synthesizer in the strain detection circuit are unified, the circuit is constituted of the unified power distributor 56, unified first delay unit 57 and unified first power synthesizer 58, the connector and coaxial cable for connecting these to one another become unnecessary, and the other constitutions (numerals 1, 3 to 5, 8 to 14, 20 to 22) are also shown in the conventional constitution diagram of FIG. 5.

Figure 14:
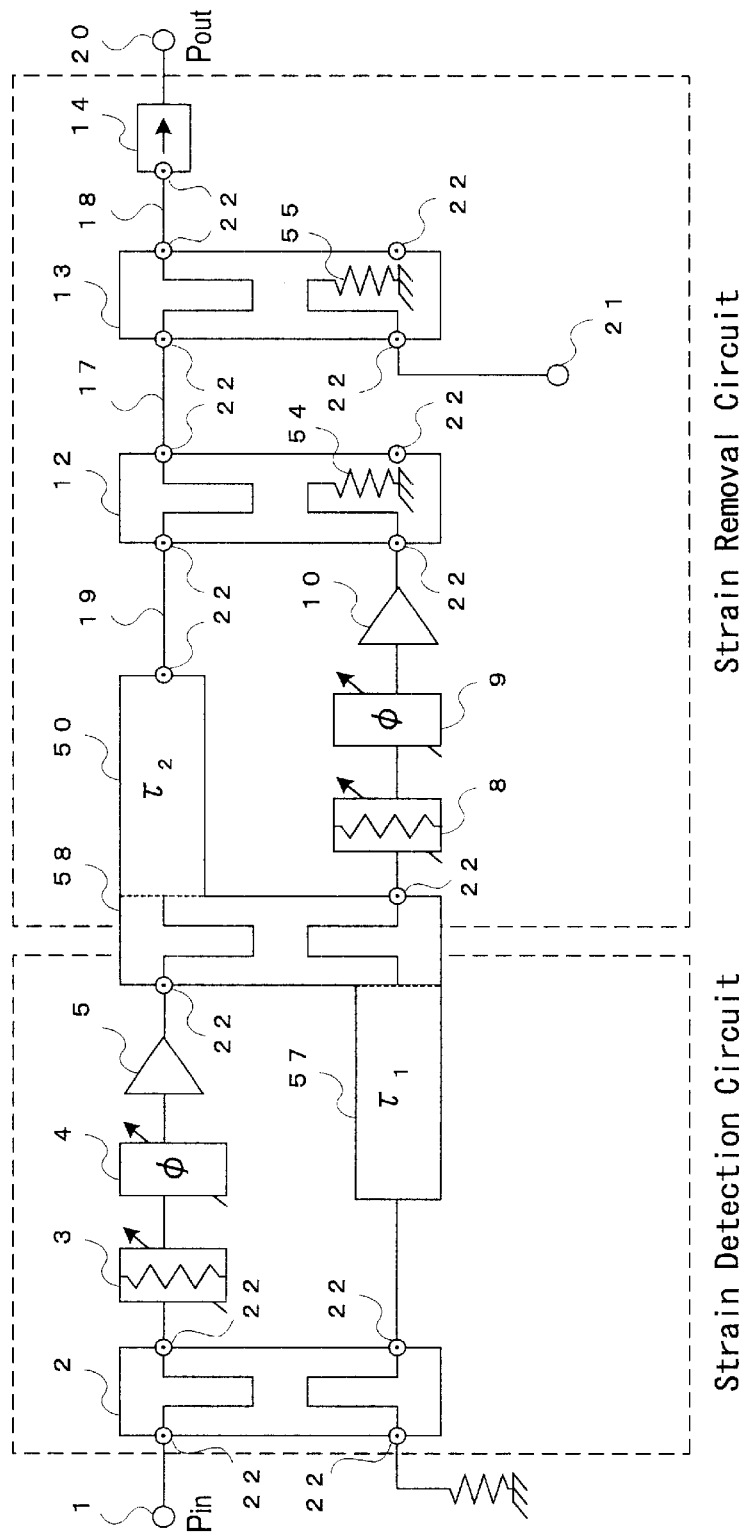
FIG. 14 is a constitution example diagram of a tenth embodiment of the strain compensation amplifier according to the present invention.

For the strain compensation amplifier according to the tenth embodiment of the present invention, as shown in FIG. 14, the first delay unit and first power synthesizer in the strain detection circuit and the second delay unit in the strain removal circuit are unified, the amplifier is constituted of the unified first delay unit 57, unified first power synthesizer 58 and unified second delay unit 50, the connector and coaxial cable for connecting these to one another become unnecessary, and the other constitutions (numerals 1 to 5, 8 to 10, 12 to 14, 20 to 22) are also shown in the conventional constitution diagram of FIG. 5.

Figure 15:
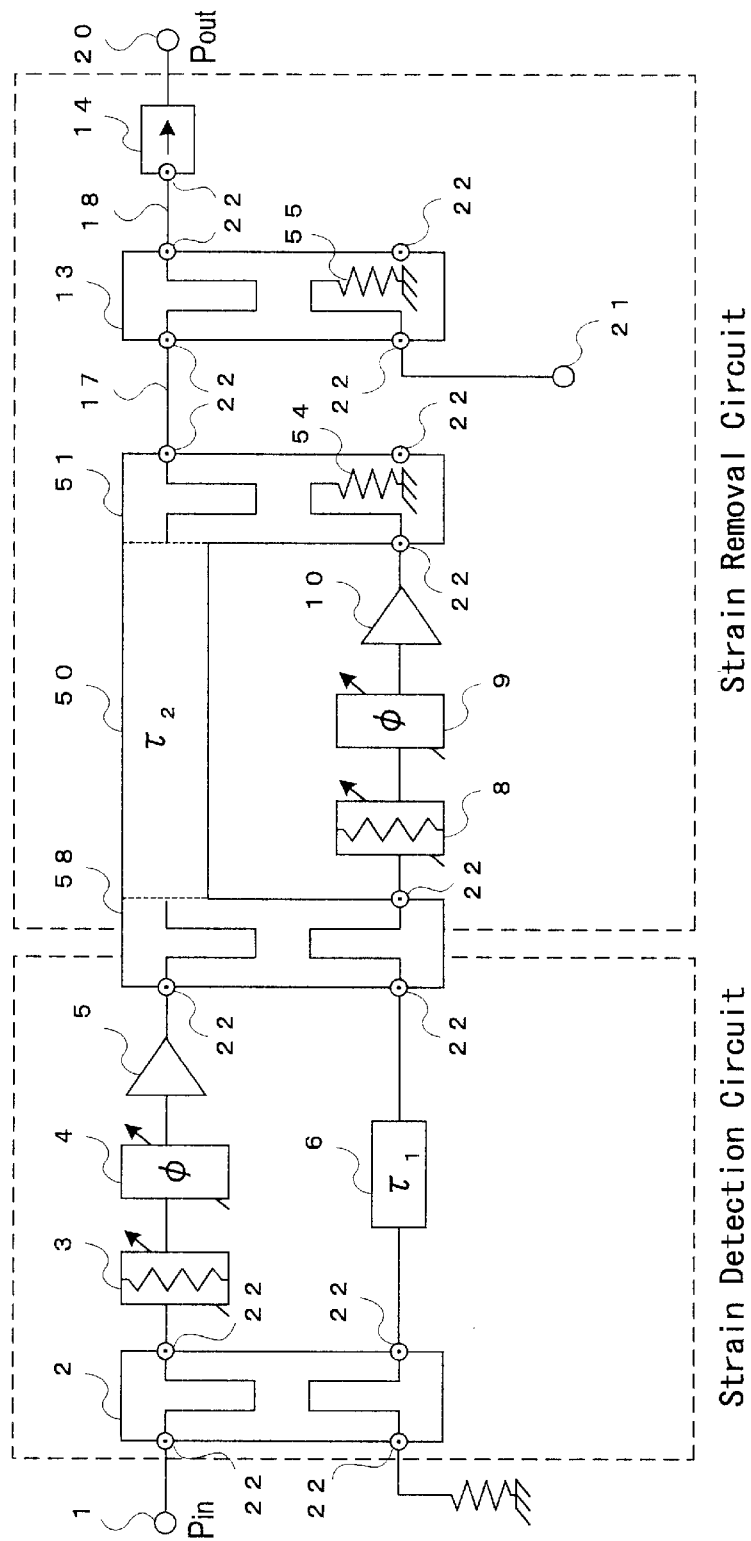
FIG. 15 is a constitution example diagram of an eleventh embodiment of the strain compensation amplifier according to the present invention.

For the strain compensation amplifier according to the eleventh embodiment of the present invention, as shown in FIG. 15, the first power synthesizer, second delay unit and second power synthesizer in the strain removal circuit are unified, the circuit is constituted of the unified first power synthesizer 58, unified second delay unit 50 and unified second power synthesizer 51, the connector and coaxial cable for connecting these to one another become unnecessary, and the other constitutions (numerals 1 to 6, 8 to 10, 13 and 14, 20 to 22) are also shown in the conventional constitution diagram of FIG. 5.

Figure 16:
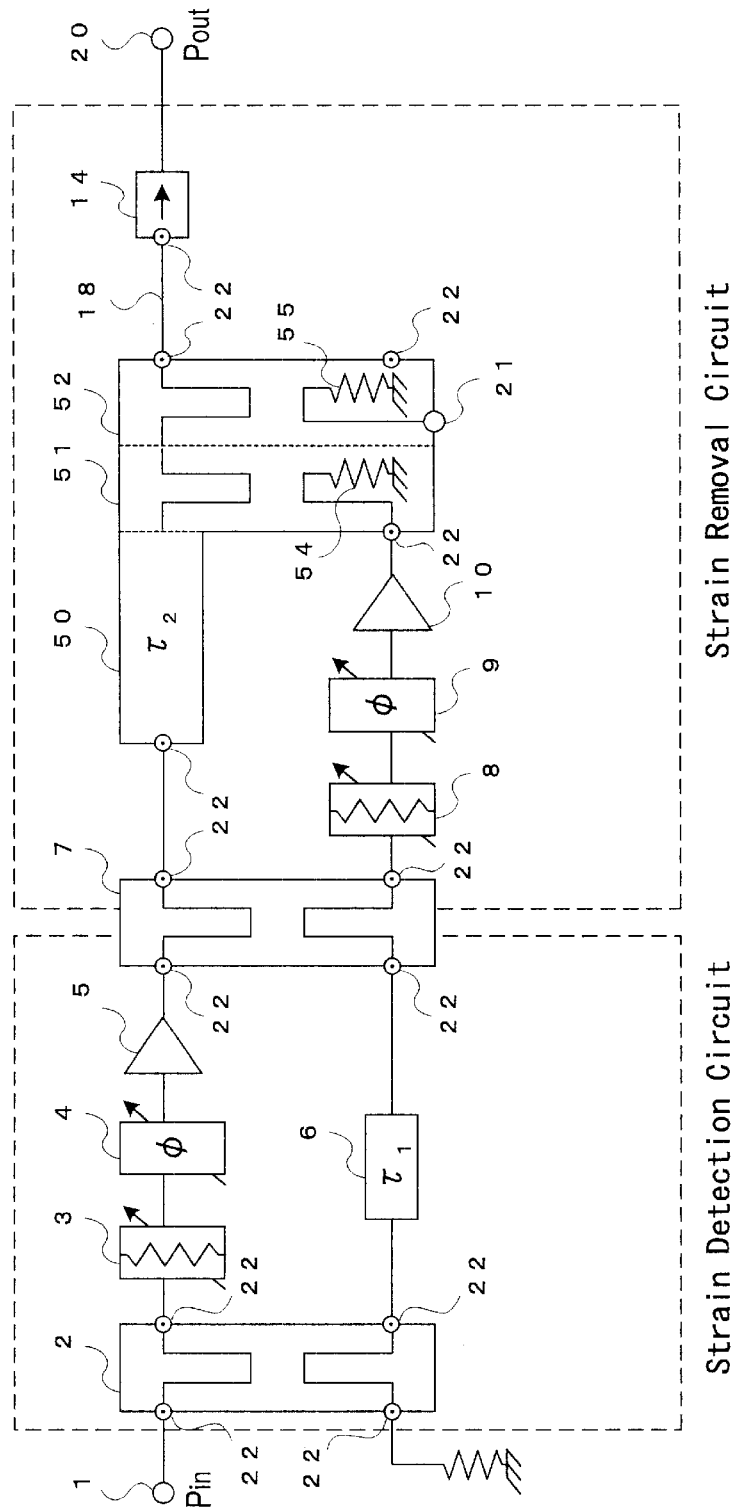
FIG. 16 is a constitution example diagram of a twelfth embodiment of the strain compensation amplifier according to the present invention.

For the strain compensation amplifier according to the twelfth embodiment of the present invention, as shown in FIG. 16, the second delay unit, second power synthesizer and directional coupler in the strain removal circuit are unified, the circuit is constituted of the unified second delay unit 50, unified second power synthesizer 51 and unified directional coupler 52, the connector and coaxial cable for connecting these to one another become unnecessary, and the other constitutions (numerals 1 to 10, 14, 20 to 22) are also shown in the conventional constitution diagram of FIG. 5.

Figure 17:
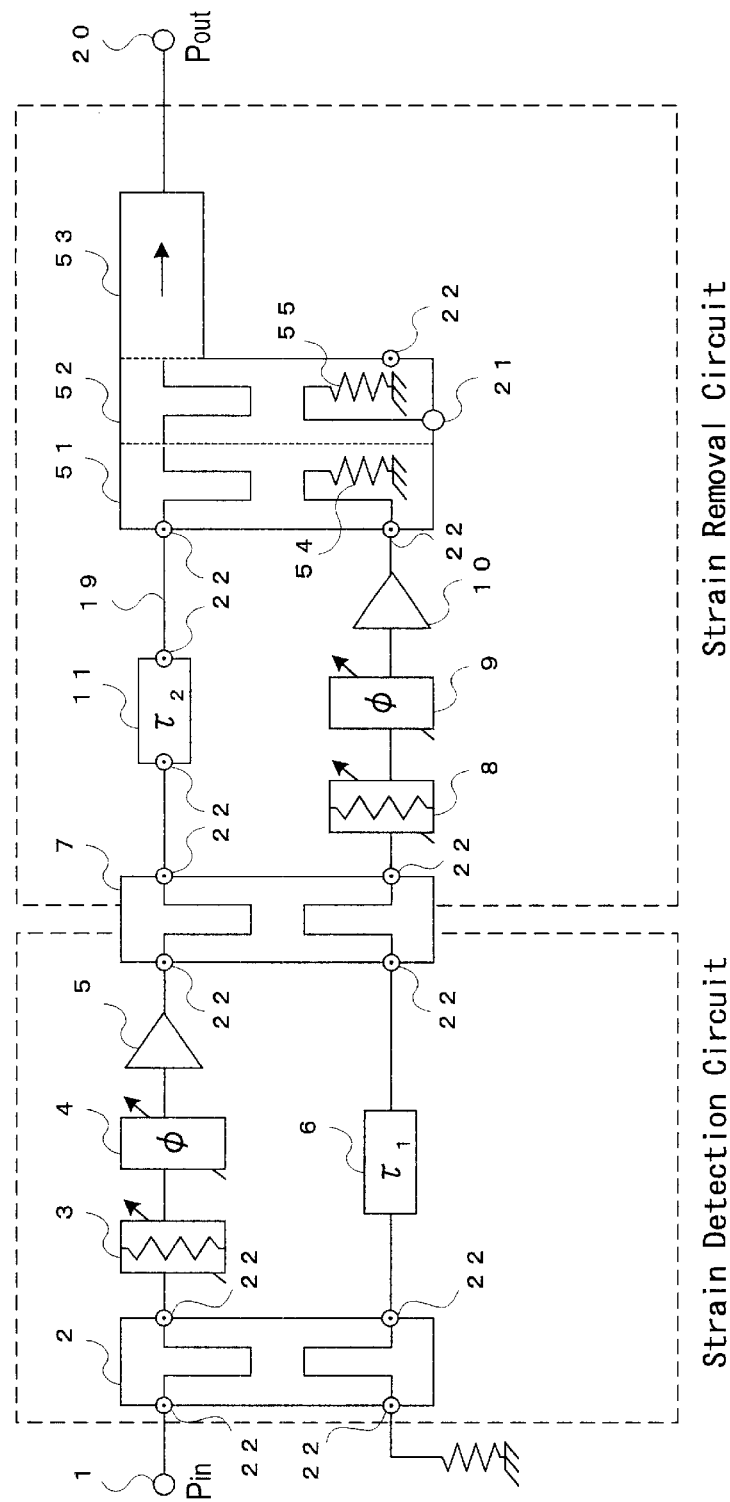
FIG. 17 is a constitution example diagram of a thirteenth embodiment of the strain compensation amplifier according to the present invention.

For the strain compensation amplifier according to the thirteenth embodiment of the present invention, as shown in FIG. 17, the second power synthesizer, directional coupler and isolator in the strain removal circuit are unified, the circuit is constituted of the unified second power synthesizer 51, unified directional coupler 52 and unified isolator 53, the connector and coaxial cable for connecting these to one another become unnecessary, and the other constitutions (numerals 1 to 11, 20 to 22) are also shown in the conventional constitution diagram of FIG. 5.

Next, with respect to a case in which adjacent four constitutions of the power distributor, first delay unit, first power synthesizer, second delay unit, second power synthesizer, directional coupler and isolator are unified, fourteenth to sixteenth embodiments will be described with reference to the constitution example diagrams of FIGS. 18 to 20. Additionally, in FIGS. 18 to 20, the state is shown in which the terminating resistor is unified, but the terminating resistor may not be unified.

Figure 18:
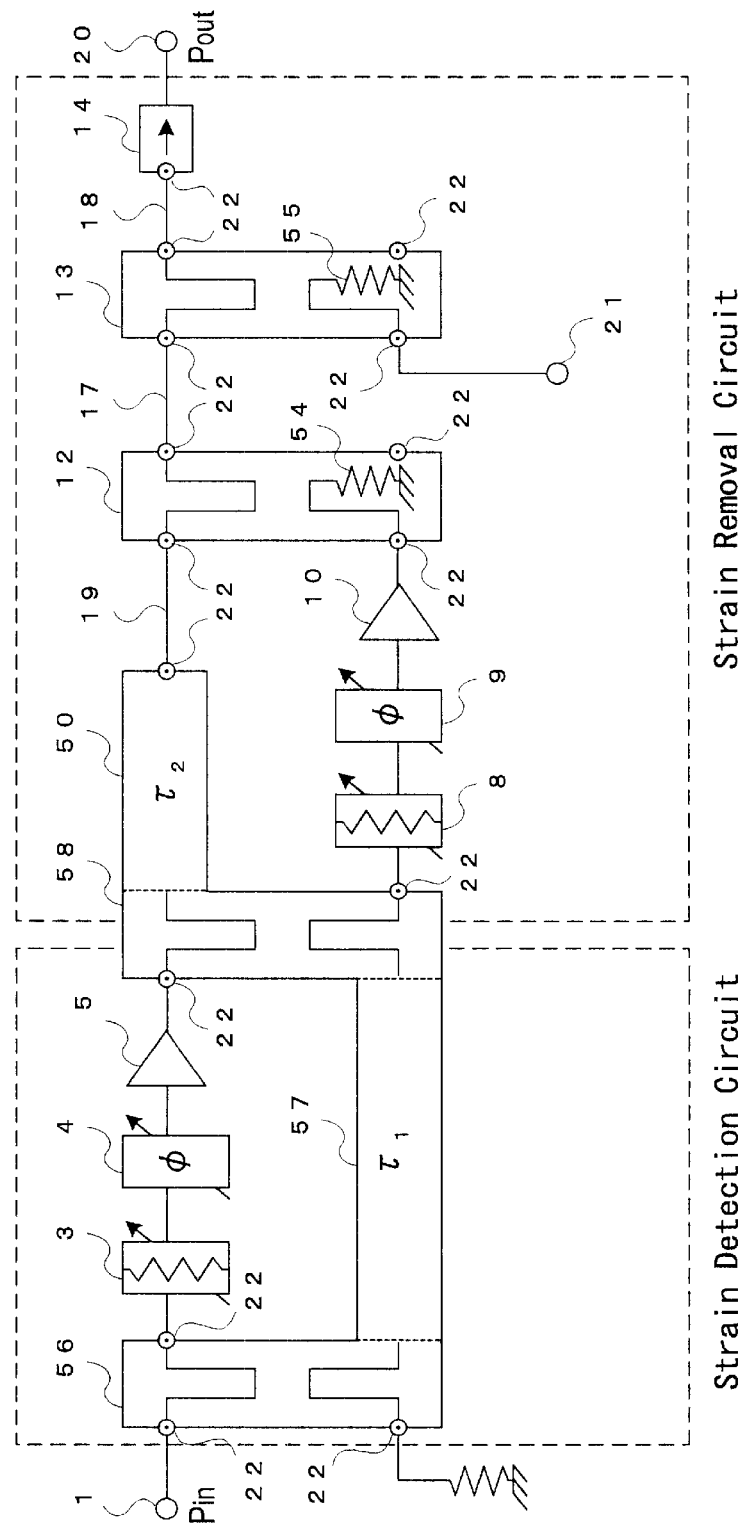
FIG. 18 is a constitution example diagram of a fourteenth embodiment of the strain compensation amplifier according to the present invention.

For the strain compensation amplifier according to the fourteenth embodiment of the present invention, as shown in FIG. 18, the power distributor, first delay unit and first power synthesizer in the strain detection circuit and the second delay unit in the strain removal circuit are unified, the amplifier is constituted of the unified power distributor 56, unified first delay unit 57, unified first power synthesizer 58 and unified second delay unit 50, the connector and coaxial cable for connecting these to one another become unnecessary, and the other constitutions (numerals 1, 3 to 5, 8 to 10, 12 to 14, 20 to 22) are also shown in the conventional constitution diagram of FIG. 5.

Figure 19:
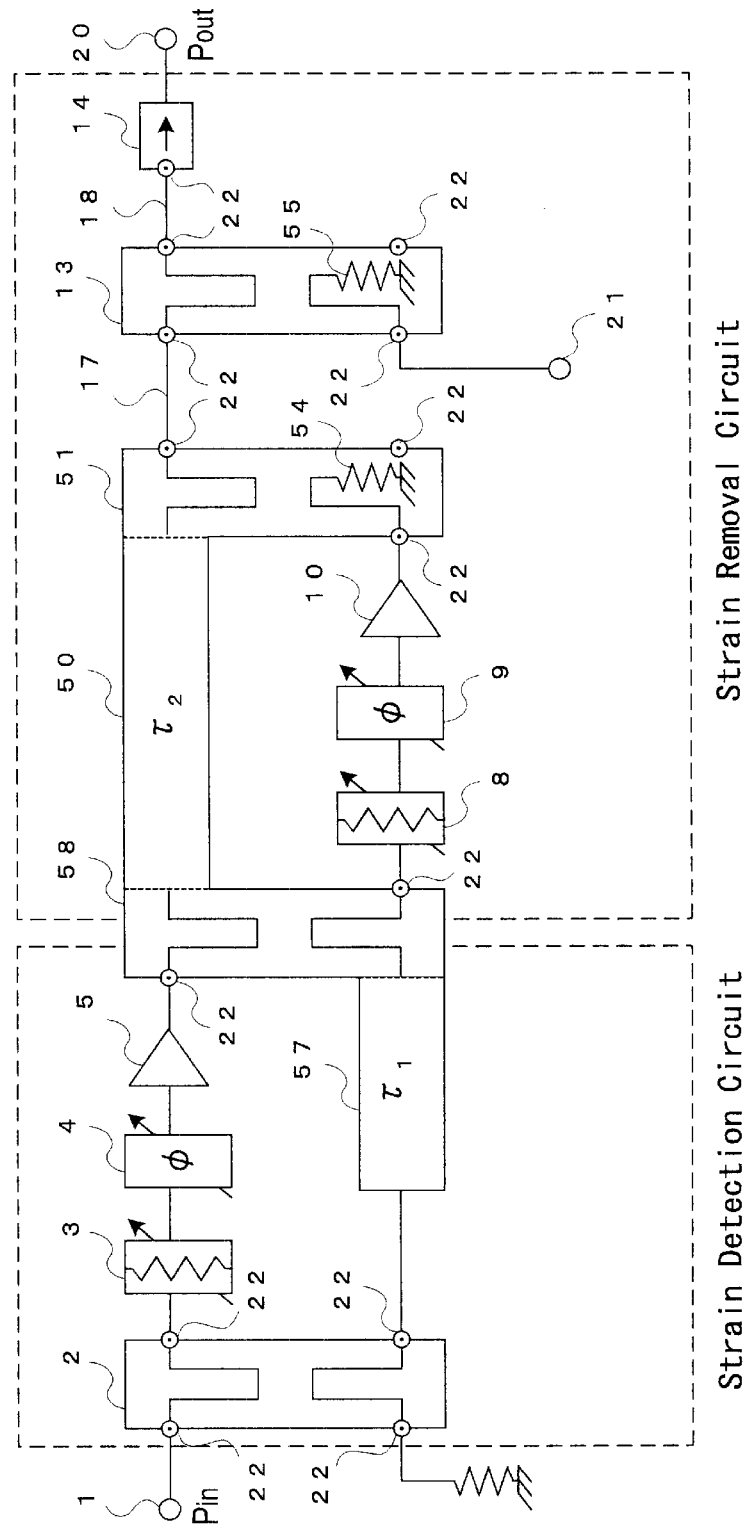
FIG. 19 is a constitution example diagram of a fifteenth embodiment of the strain compensation amplifier according to the present invention.

For the strain compensation amplifier according to the fifteenth embodiment of the present invention, as shown in FIG. 19, the first delay unit and first power synthesizer in the strain detection circuit and the second delay unit and second power synthesizer in the strain removal circuit are unified, the amplifier is constituted of the unified delay unit 57, unified first power synthesizer 58, unified second delay unit 50 and unified second power synthesizer 51, the connector and coaxial cable for connecting these to one another become unnecessary, and the other constitutions (numerals 1 to 5, 8 to 10, 13 and 14, 20 to 22) are also shown in the conventional constitution diagram of FIG. 5.

Figure 20:
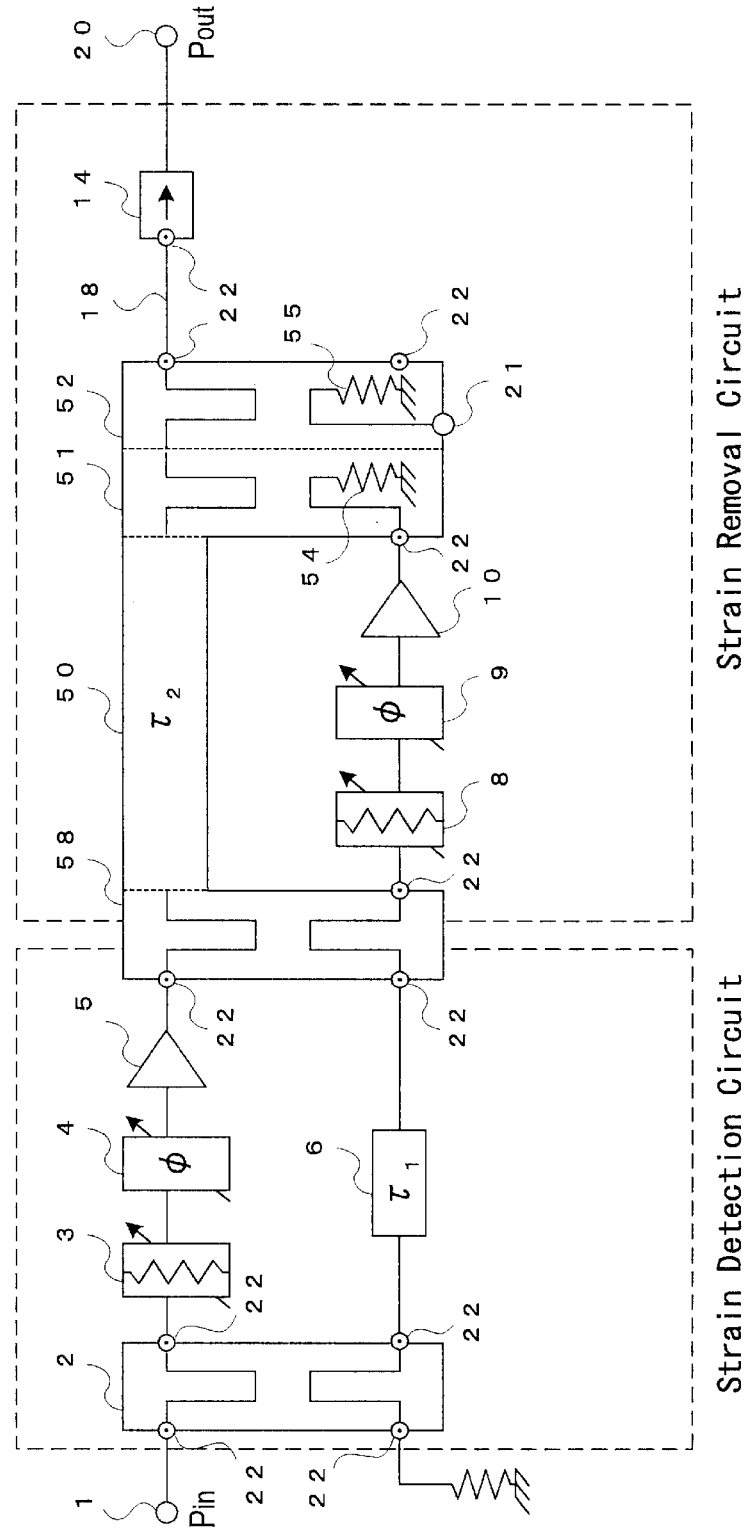
FIG. 20 is a constitution example diagram of a sixteenth embodiment of the strain compensation amplifier according to the present invention.

For the strain compensation amplifier according to the sixteenth embodiment of the present invention, as shown in FIG. 20, the first power synthesizer, second delay unit, second power synthesizer and directional coupler in the strain removal circuit are unified, the amplifier is constituted of the unified first power synthesizer 58, unified second delay unit 50, unified second power synthesizer 51 and unified directional coupler 52, the connector and coaxial cable for connecting these to one another become unnecessary, and the other constitutions (numerals 1 to 6, 8 to 10, 14, 20 to 22) are also shown in the conventional constitution diagram of FIG. 5.

Additionally, a constitution in which the second delay unit, second power synthesizer, directional coupler and isolator in the strain removal circuit are unified corresponds to the first embodiment shown in FIG. 1.

Next, with respect to a case in which adjacent five constitutions of the power distributor, first delay unit, first power synthesizer, second delay unit, second power synthesizer, directional coupler and isolator are unified, seventeenth to nineteenth embodiments will be described with reference to the constitution example diagrams of FIGS. 21 to 23. Additionally, in FIGS. 21 to 23, the state is shown in which the terminating resistor is unified, but the terminating resistor may not be unified.

Figure 21:
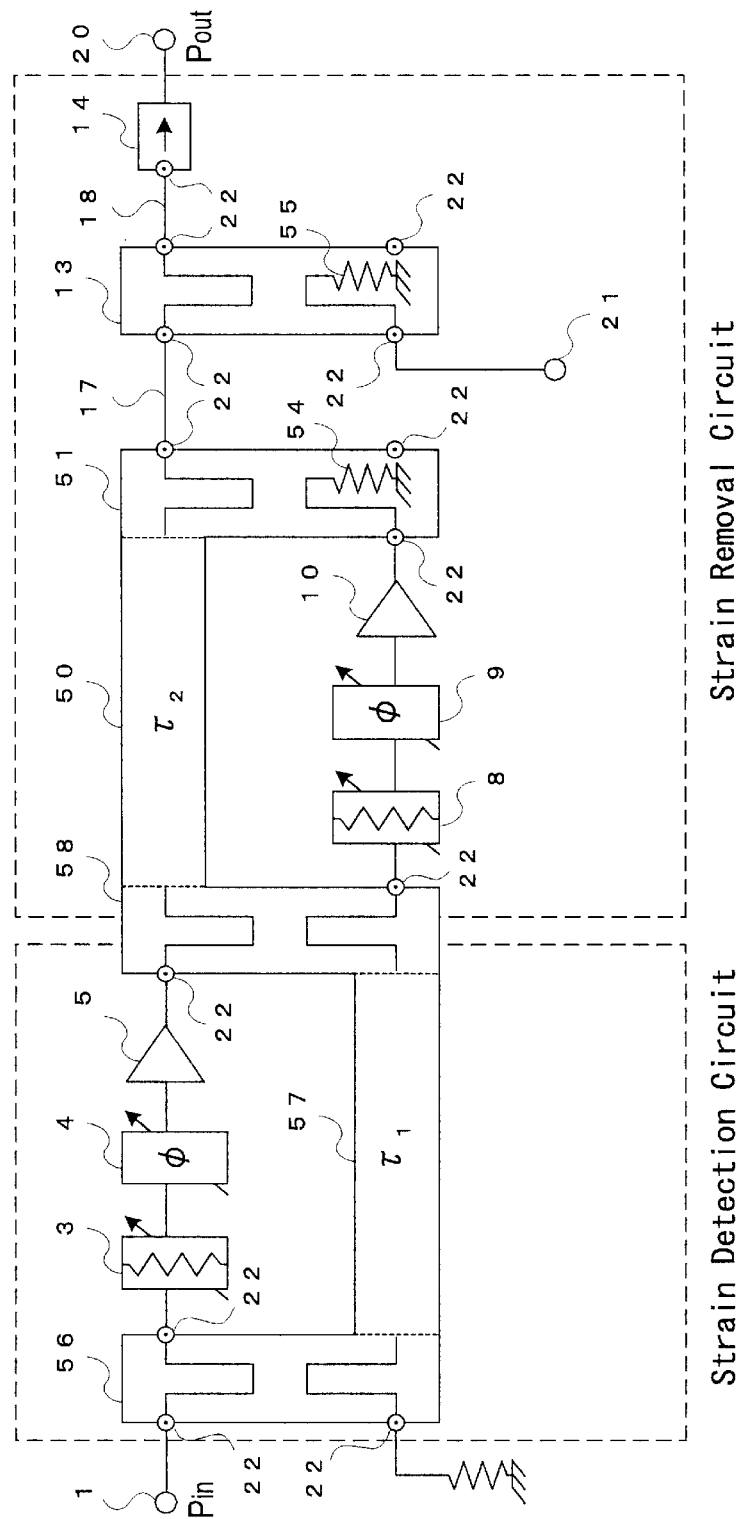
FIG. 21 is a constitution example diagram of a seventeenth embodiment of the strain compensation amplifier according to the present invention.

For the strain compensation amplifier according to the seventeenth embodiment of the present invention, as shown in FIG. 21, the power distributor, first delay unit and first power synthesizer in the strain detection circuit and the second delay unit and second power synthesizer in the strain removal circuit are unified, the amplifier is constituted of the unified power distributor 56, unified first delay unit 57, unified first power synthesizer 58, unified second delay unit 50 and unified second power synthesizer 51, the connector and coaxial cable for connecting these to one another become unnecessary, and the other constitutions (numerals 1, 3 to 5, 8 to 10, 13 and 14, 20 to 22) are also shown in the conventional constitution diagram of FIG. 5.

Figure 22:
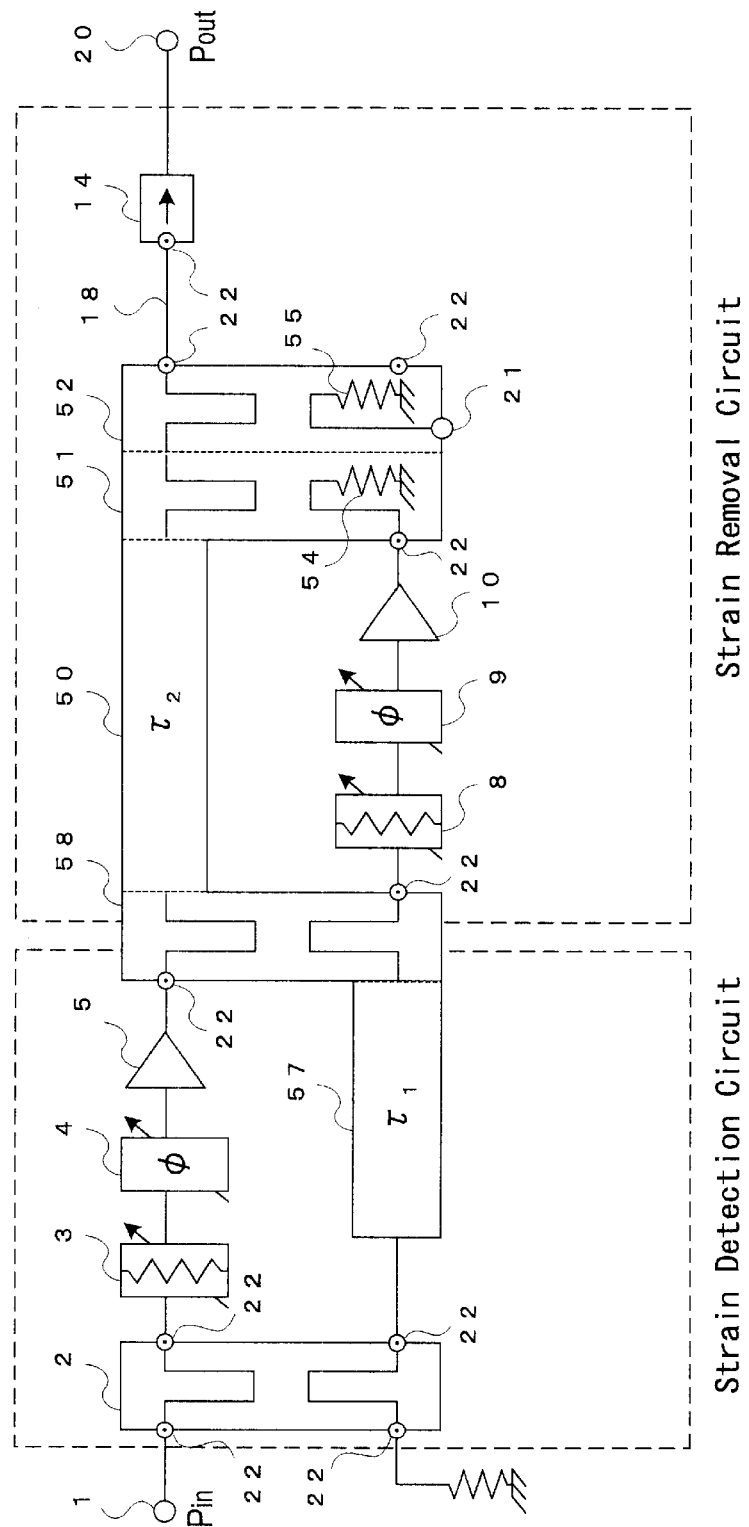
FIG. 22 is a constitution example diagram of an eighteenth embodiment of the strain compensation amplifier according to the present invention.

For the strain compensation amplifier according to the eighteenth embodiment of the present invention, as shown in FIG. 22, the first delay unit and first power synthesizer in the strain detection circuit and the second delay unit, second power synthesizer and directional coupler in the strain removal circuit are unified, the amplifier is constituted of the unified first delay unit 57, unified first power synthesizer 58, unified second delay unit 50, unified second power synthesizer 51 and unified directional coupler 52, the connector and coaxial cable for connecting these to one another become unnecessary, and the other constitutions (numerals 1 to 5, 8 to 10, 14, 20 to 22) are also shown in the conventional constitution diagram of FIG. 5.

Figure 23:
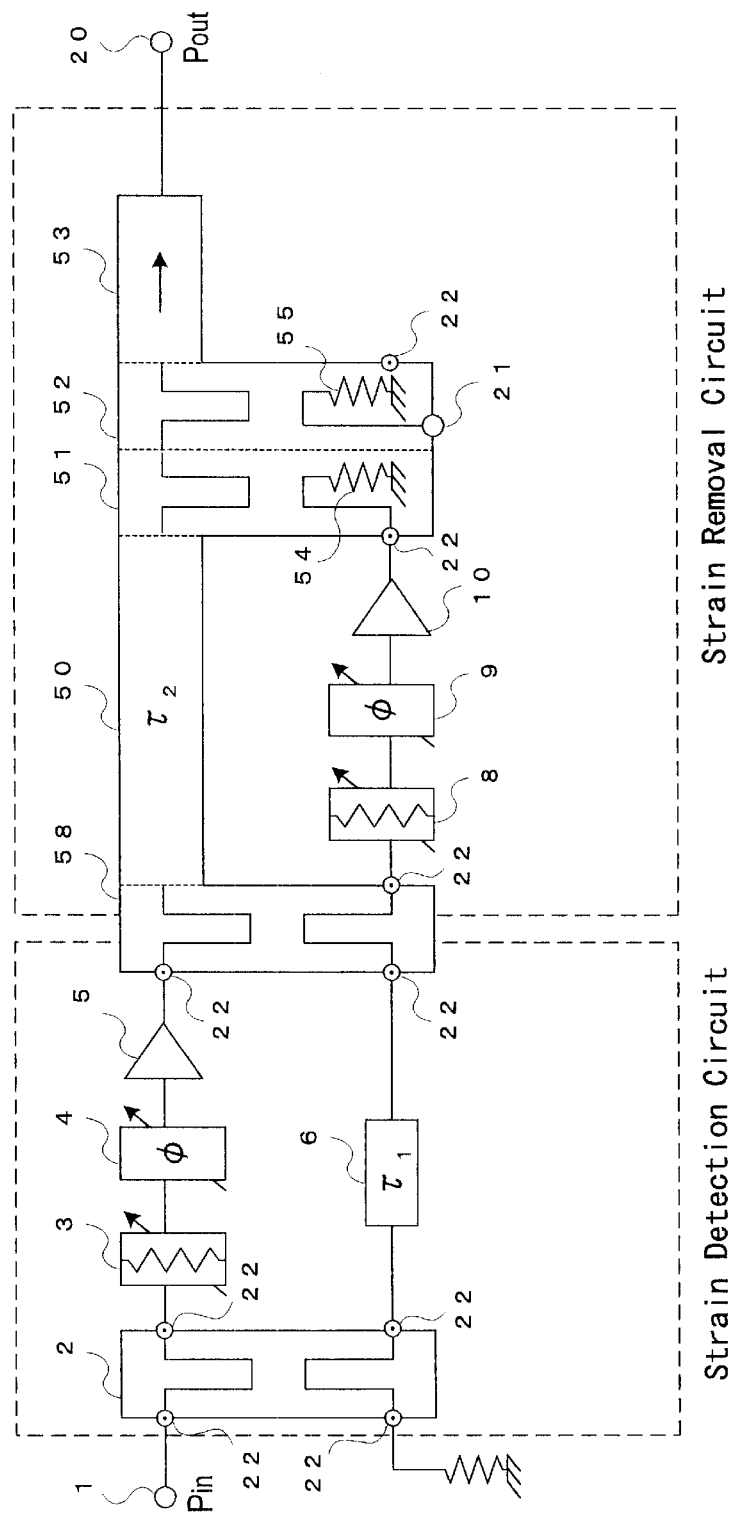
FIG. 23 is a constitution example diagram of a nineteenth embodiment of the strain compensation amplifier according to the present invention.

For the strain compensation amplifier according to the nineteenth embodiment of the present invention, as shown in FIG. 23, the first power synthesizer in the strain detection circuit and the second delay unit, second power synthesizer, directional coupler and isolator in the strain removal circuit are unified, the amplifier is constituted of the first delay unit 57, unified first power synthesizer 58, unified second delay unit 50, unified second power synthesizer 51, unified directional coupler 52 and unified isolator 53, the connector and coaxial cable for connecting these to one another become unnecessary, and the other constitutions (numerals 1 to 6, 8 to 10, 20 to 22) are also shown in the conventional constitution diagram of FIG. 5.

Next, with respect to a case in which adjacent six constitutions of the power distributor, first delay unit, first power synthesizer, second delay unit, second power synthesizer, directional coupler and isolator are unified, twentieth and twenty-first embodiments will be described with reference to the constitution example diagrams of FIGS. 24 and 25. Additionally, in FIGS. 24 and 25, the state is shown in which the terminating resistor is unified, but the terminating resistor may not be unified.

Figure 24:
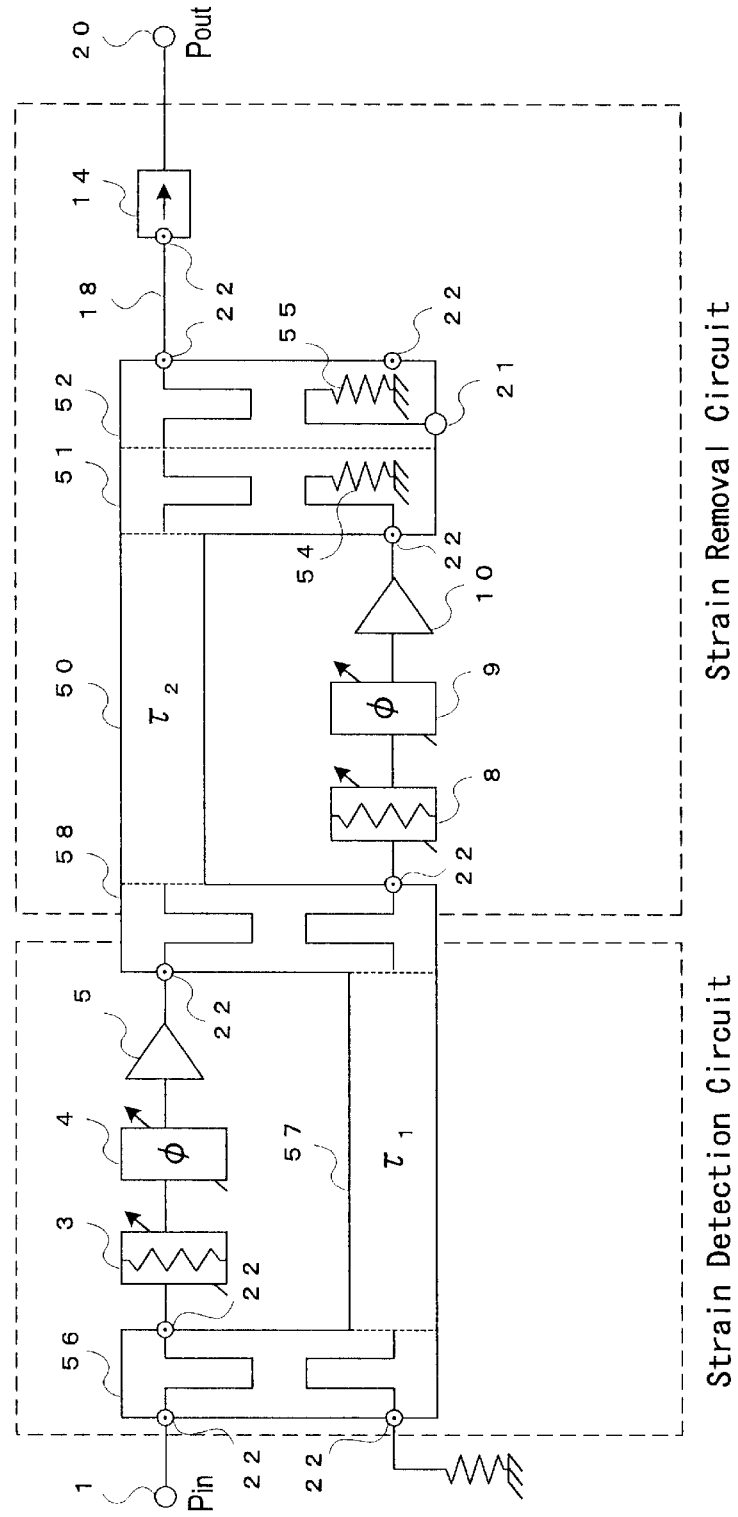
FIG. 24 is a constitution example diagram of a twentieth embodiment of the strain compensation amplifier according to the present invention.

For the strain compensation amplifier according to the twentieth embodiment of the present invention, as shown in FIG. 24, the power distributor, first delay unit and first power synthesizer in the strain detection circuit and the second delay unit, second power synthesizer and directional coupler in the strain removal circuit are unified, the amplifier is constituted of the unified power distributor 56, unified first delay unit 57, unified first power synthesizer 58, unified second delay unit 50, unified second power synthesizer 51 and unified directional coupler 52, the connector and coaxial cable for connecting these to one another become unnecessary, and the other constitutions (numerals 1, 3 to 5, 8 to 10, 14, 20 to 22) are also shown in the conventional constitution diagram of FIG. 5.

Figure 25:
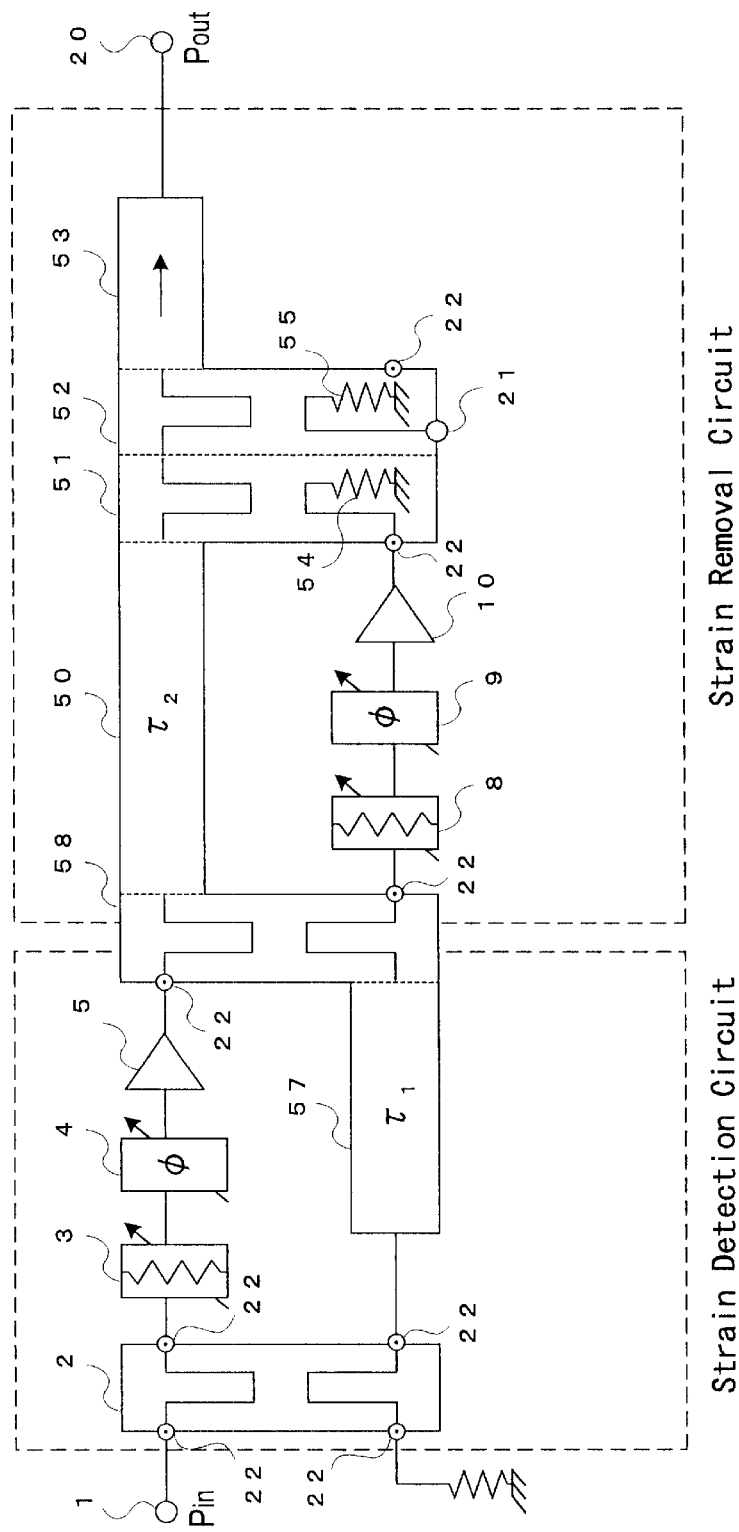
FIG. 25 is a constitution example diagram of a twenty-first embodiment of the strain compensation amplifier according to the present invention.

For the strain compensation amplifier according to the twenty-first embodiment of the present invention, as shown in FIG. 25, the first delay unit and first power synthesizer in the strain detection circuit and the second delay unit, second power synthesizer, directional coupler and isolator in the strain removal circuit are unified, the amplifier is constituted of the unified first delay unit 57, unified first power synthesizer 58, unified second delay unit 50, unified second power synthesizer 51, unified directional coupler 52 and unified isolator 53, the connector and coaxial cable for connecting these to one another become unnecessary, and the other constitutions (numerals 1 to 5, 8 to 10, 20 to 22) are also shown in the conventional constitution diagram of FIG. 5.

Moreover, a constitution in which all the seven constitutions of the power distributor, first delay unit, first power synthesizer, second delay unit, second power synthesizer, directional coupler and isolator are unified corresponds to the second embodiment shown in FIG. 3.

As described above, according to the strain compensation amplifier of the present invention, by unifying at least two or more of the power distributor, first delay unit, first power synthesizer, second delay unit, second power synthesizer, directional coupler, isolator, second power synthesizer terminating resistor and directional coupler terminating resistor, and obviating the necessity of the conventional connector and coaxial cable for connecting the respective components to one another, the following effects can be obtained.

Firstly, the power loss by the connector and coaxial cable can be reduced.

Secondly, the cost of the connector and coaxial cable can be reduced.

Thirdly, the space of the connector and coaxial cable, and operation space for connecting the connector and coaxial cable become unnecessary and the simplification and miniaturization of the structure can be realized.

Fourthly, because of the unified structure the material cost and assembly process number can be reduced.

Fifthly, the power distributor, power synthesizer and directional coupler can be simple in structure and satisfactory in properties, and can easily be adjusted.

Sixthly, the dispersion of delay amount by the dispersion of coaxial cable length can be depressed.

What is claimed is:

1. A strain compensation amplifier comprising: a strain detection circuit in which an input signal is distributed by a power distributor, and a signal obtained by amplifying one output by a main amplifier via a first variable attenuator and a first variable phase unit is synthesized with a signal obtained by adjusting a timing of another output distributed from said power distributor by a first delay unit by a first power synthesizer to detect a strain component generated in said main amplifier; and a strain removal circuit in which a signal obtained by amplifying said strain component outputted from said first power synthesizer by an auxiliary amplifier via a second variable attenuator and a second variable phase unit is reverse-phase synthesized with a signal obtained by adjusting a timing of a signal outputted from said first power synthesizer and amplified by the main amplifier by a second delay unit by a second power synthesizer to offset said strain component, a monitor output is obtained by a directional coupler, and a unidirectional property is enhanced by an isolator to obtain a power synthesis output, wherein at least two or more of said power distributor, said first delay unit, said first power synthesizer, said second delay unit, said second power synthesizer, said directional coupler, said isolator, a terminating resistor of said second power synthesizer, and the terminating resistor of said directional coupler are unified.

2. The strain compensation amplifier according to claim 1 wherein said power distributor and said first delay unit are unified.

3. The strain compensation amplifier according to claim 1 wherein said first delay unit and said first power synthesizer are unified.

4. The strain compensation amplifier according to claim 1 wherein said first power synthesizer and said second delay unit are unified.

5. The strain compensation amplifier according to claim 1 wherein said second delay unit and said second power synthesizer are unified.

6. The strain compensation amplifier according to claim 1 wherein said second power synthesizer and said directional coupler are unified.

7. The strain compensation amplifier according to claim 1 wherein said directional coupler and said isolator are unified.

8. The strain compensation amplifier according to claim 1 wherein said power distributor, said first delay unit and said first power synthesizer are unified.

9. The strain compensation amplifier according to claim 1 wherein said first delay unit, said first power synthesizer and said second delay unit are unified.

10. The strain compensation amplifier according to claim 1 wherein said first power synthesizer, said second delay unit and said second power synthesizer are unified.

11. The strain compensation amplifier according to claim 1 wherein said second delay unit, said second power synthesizer and said directional coupler are unified.

12. The strain compensation amplifier according to claim 1 wherein said second power synthesizer, said directional coupler and said isolator are unified.

13. The strain compensation amplifier according to claim 1 wherein said power distributor, said first delay unit, said first power synthesizer and said second delay unit are unified.

14. The strain compensation amplifier according to claim 1 wherein said first delay unit, said first power synthesizer, said second delay unit and said second power synthesizer are unified.

15. The strain compensation amplifier according to claim 1 wherein said first power synthesizer, said second delay unit, said second power synthesizer and said directional coupler are unified.

16. The strain compensation amplifier according to claim 1 wherein said second delay unit, said second power synthesizer, said directional coupler and said isolator are unified.

17. The strain compensation amplifier according to claim 1 wherein said power distributor, said first delay unit, said first power synthesizer, said second delay unit and said second power synthesizer are unified.

18. The strain compensation amplifier according to claim 1 wherein said first delay unit, said first power synthesizer, said second delay unit, said second power synthesizer and said directional coupler are unified.

19. The strain compensation amplifier according to claim 1 wherein said first power synthesizer, said second delay unit, said second power synthesizer, said directional coupler and said isolator are unified.

20. The strain compensation amplifier according to claim 1 wherein said power distributor, said first delay unit, said first power synthesizer, said second delay unit, said second power synthesizer and said directional coupler are unified.

21. The strain compensation amplifier according to claim 1 wherein said first delay unit, said first power synthesizer, said second delay unit, said second power synthesizer, said directional coupler and said isolator are unified.

22. The strain compensation amplifier according to claim 1 wherein said power distributor, said first delay unit, said first power synthesizer, said second delay unit, said second power synthesizer, said directional coupler and said isolator are unified.

* * * * *